(12) United States Patent
Ito

(10) Patent No.: US 6,830,175 B2
(45) Date of Patent: Dec. 14, 2004

(54) SOLDER BALL DISPENSER

(76) Inventor: Carl T. Ito, 9882 E. Caron St., Scottsdale, AZ (US) 85258

( * ) Notice: Subject to any disclaimer, the term of this patent is extended or adjusted under 35 U.S.C. 154(b) by 128 days.

(21) Appl. No.: 10/358,650

(22) Filed: Feb. 5, 2003

(65) Prior Publication Data

US 2004/0149805 A1 Aug. 5, 2004

(51) Int. Cl.$^7$ .......................... B23K 5/00; B23K 35/12; H01L 21/44
(52) U.S. Cl. .......................... 228/41; 228/246; 438/612; 438/613
(58) Field of Search .......................... 228/24, 33, 39, 228/245, 246, 254, 256; 438/612–614

(56) References Cited

U.S. PATENT DOCUMENTS

| | | | | |
|---|---|---|---|---|
| 4,736,780 A | * | 4/1988 | Matsuo | 141/82 |
| 5,279,045 A | | 1/1994 | Odashima et al. | 34/10 |
| 5,431,332 A | | 7/1995 | Kirby et al. | 228/246 |
| 5,540,377 A | | 7/1996 | Ito | 228/41 |
| 5,626,277 A | | 5/1997 | Kawada | 228/41 |
| 5,680,984 A | | 10/1997 | Sakemi | 228/246 |
| 5,695,667 A | * | 12/1997 | Eguchi et al. | 219/388 |
| 5,758,409 A | | 6/1998 | Nakazato | 29/739 |
| 5,768,775 A | | 6/1998 | Nakazato | 29/843 |
| 5,867,260 A | | 2/1999 | Sakai | 356/237 |
| 5,878,911 A | | 3/1999 | Lin et al. | 221/278 |
| 6,003,753 A | | 12/1999 | Hwang et al. | 228/41 |
| 6,013,899 A | | 1/2000 | Eguchi et al. | 219/388 |
| 6,056,190 A | | 5/2000 | Foulke et al. | 228/246 |
| 6,065,201 A | | 5/2000 | Sakai | 29/430 |
| 6,095,398 A | | 8/2000 | Takahashi et al. | 228/41 |
| 6,109,509 A | | 8/2000 | Sakai et al. | 228/246 |
| 6,119,927 A | | 9/2000 | Ramos et al. | 228/254 |
| 6,170,737 B1 | | 1/2001 | Foulke et al. | 228/245 |
| 6,176,008 B1 | | 1/2001 | Ueoka | 29/743 |
| 6,182,356 B1 | | 2/2001 | Bolde | 29/821 |
| 6,202,918 B1 | | 3/2001 | Hertz | 228/246 |
| 6,227,437 B1 | * | 5/2001 | Razon et al. | 228/254 |
| 6,244,788 B1 | | 6/2001 | Hernandez | 406/144 |
| 6,253,985 B1 | * | 7/2001 | Kajii | 228/41 |
| 6,270,002 B1 | | 8/2001 | Hayashi et al. | 228/246 |
| 6,302,316 B1 | | 10/2001 | Hayashi et al. | 228/223 |
| 6,325,272 B1 | | 12/2001 | May et al. | 228/41 |
| 6,336,581 B1 | * | 1/2002 | Tuchiya et al. | 228/33 |
| 6,352,189 B1 | | 3/2002 | Kobayashi | 228/8 |
| 6,412,685 B2 | | 7/2002 | Hertz et al. | 228/246 |
| 6,422,452 B2 | | 7/2002 | Yamamoto et al. | 228/246 |
| 6,427,903 B1 | * | 8/2002 | Foulke et al. | 228/246 |
| 6,541,364 B2 | * | 4/2003 | Mukuno et al. | 438/612 |
| 2001/0007330 A1 | | 7/2001 | Kajii | 228/103 |
| 2001/0009261 A1 | | 7/2001 | Yamamoto et al. | 228/180.22 |
| 2001/0015372 A1 | | 8/2001 | Yamamoto et al. | 228/180.22 |
| 2002/0088843 A1 | | 7/2002 | Saso | 228/246 |
| 2002/0135064 A1 | | 9/2002 | Hazeyama et al. | 257/737 |

FOREIGN PATENT DOCUMENTS

| | | | |
|---|---|---|---|
| JP | 2000-133923 A | * | 5/2000 |
| JP | 2003-243440 A | * | 8/2003 |

* cited by examiner

*Primary Examiner*—L. Edmondson
(74) *Attorney, Agent, or Firm*—Cahill, von Hellens & Glazer, P.L.C.

(57) ABSTRACT

A solder ball dispenser (100) has feeder unit, head unit chambers (200, 300) and a pneumatic singulator (370). Solder balls (101) are mobilized in the chambers by moving air. The solder ball dispenser receives a continuous supply of unorganized solder balls and arranges them in a single stack (340). The singulator ejects the balls one at a time to a target device such as a Ball Grid Array. The dispenser has a plurality of conduits (331–338) for applying one of air pressure and vacuum to various points of the chambers and the channel. Solder balls are transported through the dispenser and ejected from the dispenser by the programmed application of air pressure and vacuum. The trajectory of each solder ball is stopped before moving to a next position in the pneumatic singulator. No solid object causes solder balls to move within the dispenser or to be ejected from the dispenser.

20 Claims, 29 Drawing Sheets

SECTION A - A

SOLDER BALL DISPENSER

BACKGROUND OF THE INVENTION

1. Field of the Invention

This invention relates to the field of metal fusion bonding, and more particularly, to preplacing a quantity of unfused solid filler onto a target device, such as a Ball Grid Array (BGA), prior to applying fusing heat and prior to juxtaposing parts to be joined. The unfused solid filler has a particular size and shape, more specifically, that of a solder ball.

2. Description of the Related Art

Devices that dispense solder balls through mechanical means are well known. Solder balls are used for attaching BGAs to printed circuits. For BGAs, a typical solder ball has a diameter of 30 mils. Solder balls are also used for attaching flip chips to integrated circuit packages. For flip chips, a typical solder ball has a diameter of 10–20 mils. As microelectronics become smaller, the size of solder balls for such microelectronics also becomes smaller.

Disadvantageously, all known prior art solder ball dispensing devices use, at least in part, mechanical parts such as levers, to transport solder balls through the prior art devices and/or to eject them out of the prior art devices. Known dispensing devices have a problem of solder balls sticking to mechanical parts that move the solder balls through such dispensing devices, thereby jamming the dispensing device. A solder ball sticks to a mechanical part as a result of a cold weld bond to a metallic component or as a result of static electricity. As solder balls become smaller, the probability of a cold weld bond of a solder ball to a metallic component occurring becomes greater. As solder balls become smaller, the effect of static electricity on the solder balls becomes more pronounced.

As solder balls become smaller, the levers that move the solder balls have to be machined to higher tolerances, thereby making them more expensive. When a dispensing device has a plurality of small mechanical parts that work together, their tolerances are cumulative, thereby disadvantageously requiring even higher tolerances. Also, as levers become smaller, the lack of strength of the levers becomes a problem. Furthermore, proportionately scaled down versions of devices, such as solenoids, which actuate levers, are not always available.

Most known prior art solder ball dispensing devices utilize solely mechanical parts; however, a few known dispensing devices utilize, in part, gas pressure and vacuum to move solder balls through the device. Examples such of known devices are:

U.S. Pat. No. 5,279,045, issued Jan. 18, 1994, to Odashima et al., entitled Minute Particle Loading Method and Apparatus uses a fluid to stir up minute particles in an enclosed space. However, Odashima, et al., has no provision for dispensing solder balls one at a time.

U.S. Pat. No. 5,431,332, issued Jul. 11, 1995, to Kirby et al., entitled Method and Apparatus for Solder Sphere Placement Using an Air Knife directs a column of air across a surface of a stencil to remove excess solder balls. However, Kirby, et al., has no provision for dispensing solder balls one at a time.

U.S. Pat. No. 5,626,277, issued May 6, 1997, to Kawada entitled Mounting Apparatus of Solder Balls has a ball suction jig that uses vacuum for collecting solder balls and a blow gas for agitating solder balls in a ball feed jig. However, Kawada has no provision for dispensing solder balls one at a time.

U.S. Pat. No. 5,878,911, issued Mar. 9, 1999, to Lin et al., entitled Solder-Ball Supplying Apparatus discloses vacuum means used to suck out a preset amount of solder balls from a storage tank. However Lin et al., uses a valve to control the flow of solder balls through the apparatus.

U.S. Pat. No. 6,003,753, issued Dec. 21, 1999, to Hwang et al., entitled Air-Blow Solder Ball Loading System for Micro Ball Grid Arrays applies fluid pressure to solder balls within a tub to force the solder balls to float on gas pressure toward a vacuum head that includes vacuum apertures for picking up solder balls from the tub. However, Hwang et al., has no provision for dispensing solder balls one at a time.

U.S. Pat. No. 6,182,356, issued Feb. 6, 2001, to Bolde entitled Apparatus for Solder Ball Mold Loading has an air supply line connected to a reservoir and blowing air onto solder balls in the reservoir to break up accumulation of solder balls at the bottom of the reservoir, and a vacuum for facilitating reception of the solder balls into cavities of a mold. However, Bolde accomplishes dispensing of individual solder balls by mechanical movement of a feeder exit port across the mold.

U.S. Pat. No. 6,227,437, issued May 8, 2001, to Razon et al., entitled Solder Ball Delivery and Reflow Apparatus and Method of Using the Same uses a pressurized fluid that is introduced into a reservoir to urge a continuous flow of solder material through a feed tube from the reservoir to a capillary. The capillary deposits one solder ball at a time onto a substrate. However, the capillary uses a mechanical indexing slide mechanism to select one solder ball at a time.

U.S. Pat. No. 6,244,788, issued Jun. 12, 2001, to Hernandez entitled Apparatus for Supplying Solder Balls uses a fluid to actuate a continuous flow of solder balls from a reservoir to a receptacle. However, Hernandez does not disclose dispensing solder balls one at a time.

U.S. Pat. No. 6,325,272, issued Dec. 4, 2001, to May et al., entitled Apparatus and Method for Filling a Ball Grid Array uses air to force solder balls into and out of holes of a BGA template. However, May et al., does not disclose any method or apparatus for transferring solder balls to the BGA template.

U.S. patent application Publication No. 2002/0088843 A1, by Saso, published Jul. 11, 2002, entitled Solder Ball Pitcher is a device for supplying a series of individual solder balls in which solder balls are moved by solid mechanical components which also move. However, Saso does not disclose movement of solder balls as a result of application of vacuum or air pressure.

U.S. patent application Publication No. 2002/0135064 A1, by Hazeyama et al., published Sep. 26, 2002, entitled Transfer Apparatus for Arraying Small Conductive Bumps on Substrate and/or Chip has a vacuum source, and a pallet for holding solder balls in a same pattern as a pattern of conductive pads on a semiconductor chip, and uses air to push the array of conductive balls sidewards and to make the array of conductive balls float from the pallet to the semiconductor chip. However, Hazeyama et al., does not disclose any method or apparatus for transferring solder balls to the array.

Thus, what is needed is a solder ball dispenser for dispensing solder balls to BGAs, which overcomes the disadvantages of the prior art by using only air pressure and vacuum to move solder balls through the solder ball dispenser. What is also needed is a solder ball dispenser for dispensing solder balls to BGAs that can be easily scaled down to dispense smaller solder balls to flip chips.

SUMMARY OF THE INVENTION

Briefly described, and in accordance with a preferred embodiment thereof, the present invention relates to an apparatus for dispensing a series of single solder balls, which includes a curved chamber for containing a multiplicity of solder balls set in motion by gas flowing within the curved chamber, an elongate chamber having a first end and a second end, and an ejector connected to the second end of the elongate chamber. The first end of the elongate chamber connected to the curved chamber for receiving solder balls from the curved chamber. The elongate chamber is sized to accept a single line of solder balls. The ejector receives the single line of solder balls and, in response to application of gas pressure and vacuum on the solder balls, dispenses a series of single solder balls. All movement of solder balls within the apparatus is caused only by application of gas pressure and vacuum.

The present invention also relates to an apparatus for dispensing a series of single solder balls, which includes a substantially circular chamber having a depth of approximately the diameter of the solder balls. The chamber has an opening for delivering blowing gas into the chamber for setting the solder balls within the chamber in motion, and a buffer chute for allowing one solder ball at a time to escape, against gravity, from the chamber as a result of the motion of the one ball, and for temporarily storing a single line of solder balls from which the balls are dispensed.

The present invention further relates to an apparatus for dispensing a series of single solder balls. The apparatus includes an elongate chamber holding a single line of solder balls, and a pneumatic singulator connected to the elongate chamber. The pneumatic singulator receives the single line of solder balls. The pneumatic singulator has a channel for the balls. The channel has a plurality of openings for application of cycles of alternate gas pressure and vacuum to the channel. Each half cycle causes at least one solder ball from the single line of solder balls to move from one of the plurality of openings to another of the plurality of openings.

The present invention further relates to an apparatus for ejecting a series of single solder balls, which includes an elongate chamber holding a single line of solder balls and also includes a pneumatic singulator connected to the elongate chamber. The pneumatic singulator receives the single line of solder balls. The pneumatic singulator has a channel for the balls. The channel has a plurality of bends. The channel has a plurality of openings at which one of gas pressure and vacuum is applied to move solder balls through the channel. The balls pause at each bend of the channel prior to being ejected one at a time from the apparatus.

The present invention further relates to a method of organizing solder balls into a single line, which includes the steps of swirling a multiplicity of solder balls in a first curved chamber that has a size substantially larger than a solder ball diameter in all three dimensions; transferring at least some of the multiplicity of solder balls into a second chamber that has a size substantially larger than a solder ball diameter in only two dimensions and a size approximately of a solder ball diameter in the third dimension; swirling the at least some of the multiplicity of solder balls in the second curved chamber; and transferring a plurality of the at least some of the multiplicity of solder balls into an elongate chamber that has a size substantially larger than a solder ball diameter in only one dimension and a size approximately of a solder ball diameter in two dimensions.

The present invention further relates to a method of dispensing solder balls that comprises the steps of (a) receiving a single line of solder balls; (b) transferring each solder ball from the single line of solder balls into a pneumatic singulator; (c) moving each solder ball through the pneumatic singulator using only vacuum and gas pressure; (d) causing each solder ball to pause at least two times while moving through the pneumatic singulator; (e) causing each solder ball to change trajectory by at least 45° after each pause; and (f) ejecting, one at a time, each solder ball out of the pneumatic singulator.

The present invention further relates to a method of dispensing solder balls that comprises the steps of (a) swirling a multiplicity of solder balls in a first curved chamber, in which the first curved chamber has a size substantially larger than a solder ball diameter in all three dimensions; (b) transferring at least some of the multiplicity of solder balls into a second chamber, in which the second chamber has a size substantially larger than a solder ball diameter in only two dimensions and having a size approximately of a solder ball diameter in the third dimension; (c) swirling the at least some of the multiplicity of solder balls in the second curved chamber; (d) transferring a plurality of the at least some of the multiplicity of solder balls into an elongate chamber, in which the elongate chamber has a size substantially larger than a solder ball diameter in only one dimension and has a size approximately of a solder ball diameter in two dimensions; (e) transferring the plurality of the at least some of the multiplicity of solder balls into a pneumatic singulator; and (f) ejecting, one at a time, each solder ball of the plurality of the at least some of the multiplicity of solder balls out of the pneumatic singulator.

BRIEF DESCRIPTION OF THE DRAWINGS

The present invention will be described with greater specificity and clarity with reference to the following drawings, in which.

DESCRIPTION OF THE PREFERRED EMBODIMENT

Figure 1:
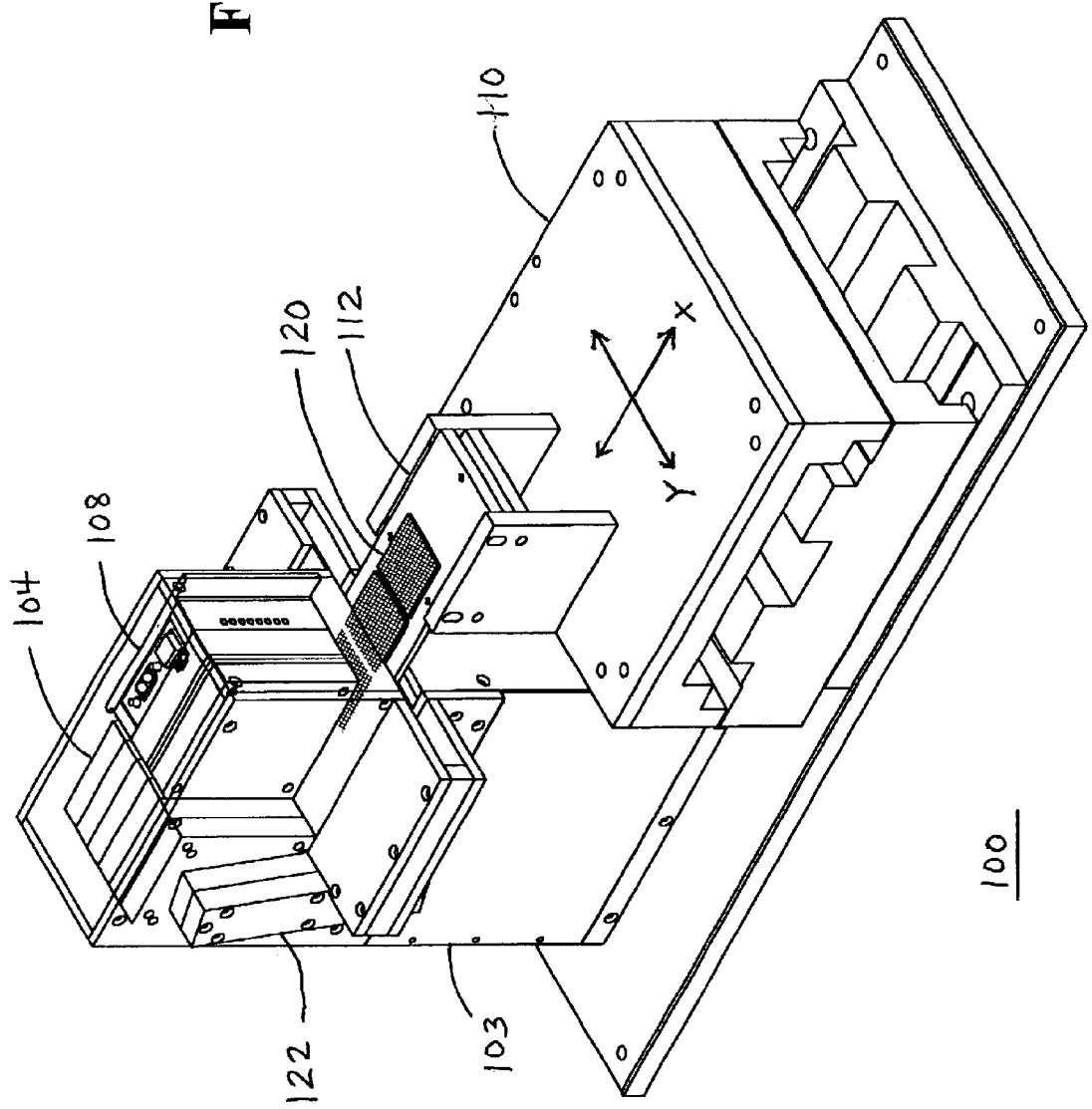
FIG. 1 is a perspective view of a solder ball dispenser in accordance with the invention.

FIG. 1 is a perspective view of a solder ball dispenser 100 that receives a disorganized supply of solder balls, or balls, 101 and dispenses them one at a time, solely through application of air pressure and vacuum. The solder ball dispenser, or dispenser, 100 comprises a feeder unit 104 and a head unit 108, mounted on a frame 103. The frame 103 is mounted to a base 105. A reservoir (not shown) of balls is under the frame 103. An x-y table 110 is mounted to the base 105. A platform 112 is attached to the x-y table 110 and moves with the x-y table. Three BGAs 120 are shown on the platform 112. The x-y table 110 is in a position such that one of the BGAs 120 is under the head unit 108 and is only partially visible. When the dispenser 100 is operating, the x-y table 110 moves the BGA 120 that is a current target device to a plurality of positions under the head unit 108 while balls 101 are ejected from the head unit.

Figure 2:
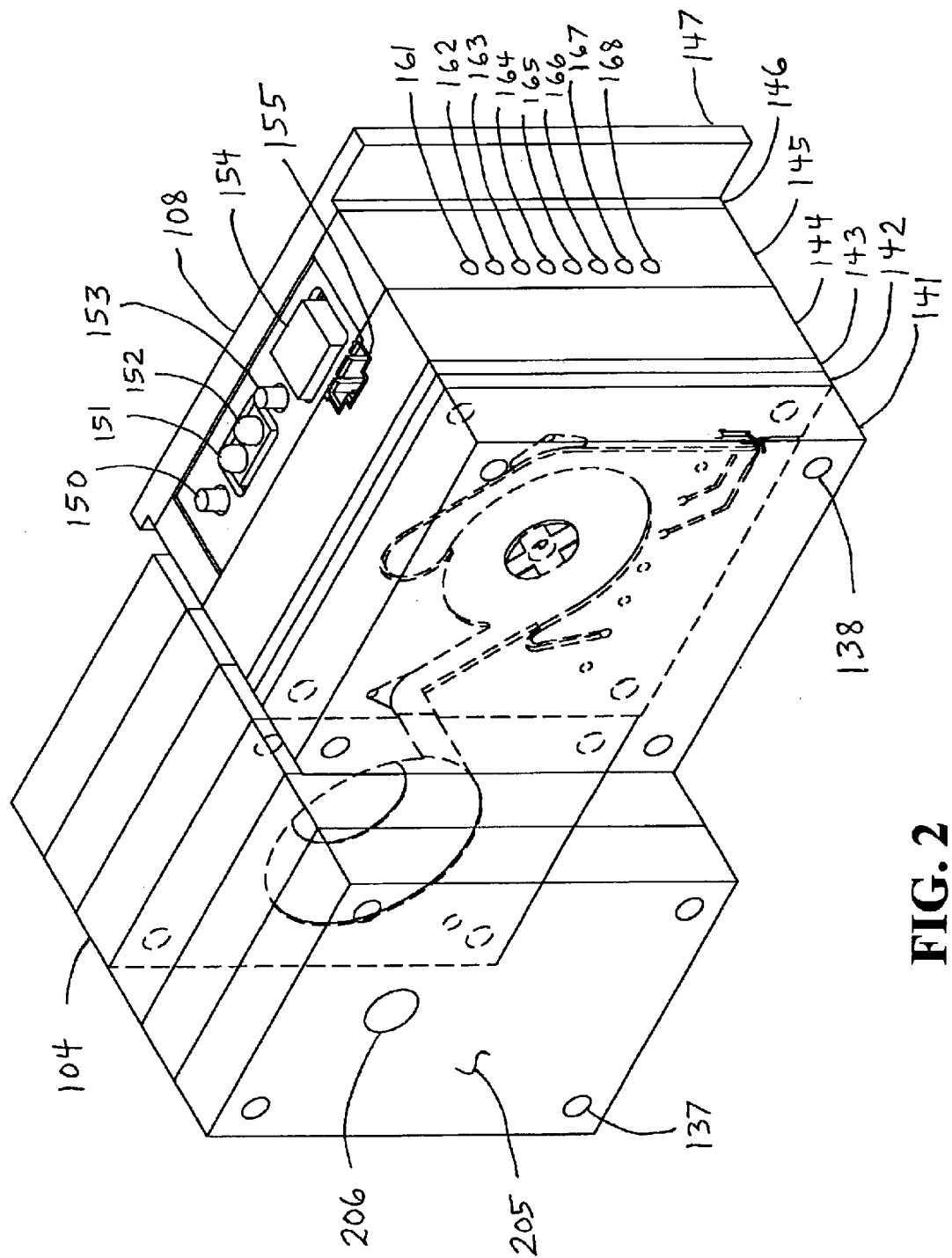
FIG. 2 is a perspective view of a feeder unit and a head unit of the solder ball dispenser of FIG. 1.

FIG. 2 is a perspective view of the feeder unit 104 attached to the head unit 108. The feeder unit 104 is assembled from a plurality of flat plates, preferably six flat plates 131–136, secured together by means such as bolts through a set of holes 137. The head unit 108 is assembled from a plurality of flat plates, preferably seven flat plates 141–147, secured together by means such as bolts through a set of holes 138. The seven flat plates of the head unit 108 comprise a front plate 141, a head plate 142, a back plate 143, an interface housing 144, a Universal Serial Bus (USB) housing 145, a USB controller board assembly 146 and a head mount 147. The material of the plates 131–136 and 141–147 is preferably metal, for durability; however, the plates have been made from plastic which has the advantage of being transparent and allowing the balls 101 within the dispenser 100 to be readily seen. On a top side of the head unit 108 are a test button 150, two controller status Light-Emitting Diodes (LEDs) 151–152, a controller reset button 153, a USB connector 154 and solenoid power connector 155. Eight solenoid LEDs 161–168 are mounted on a right side of the head unit 108. Advantageously, the dispenser 100 is easily cleaned by separating the plates 131–136 and 141–147, thereby allowing any balls to easily come out of the dispenser.

Figure 3:
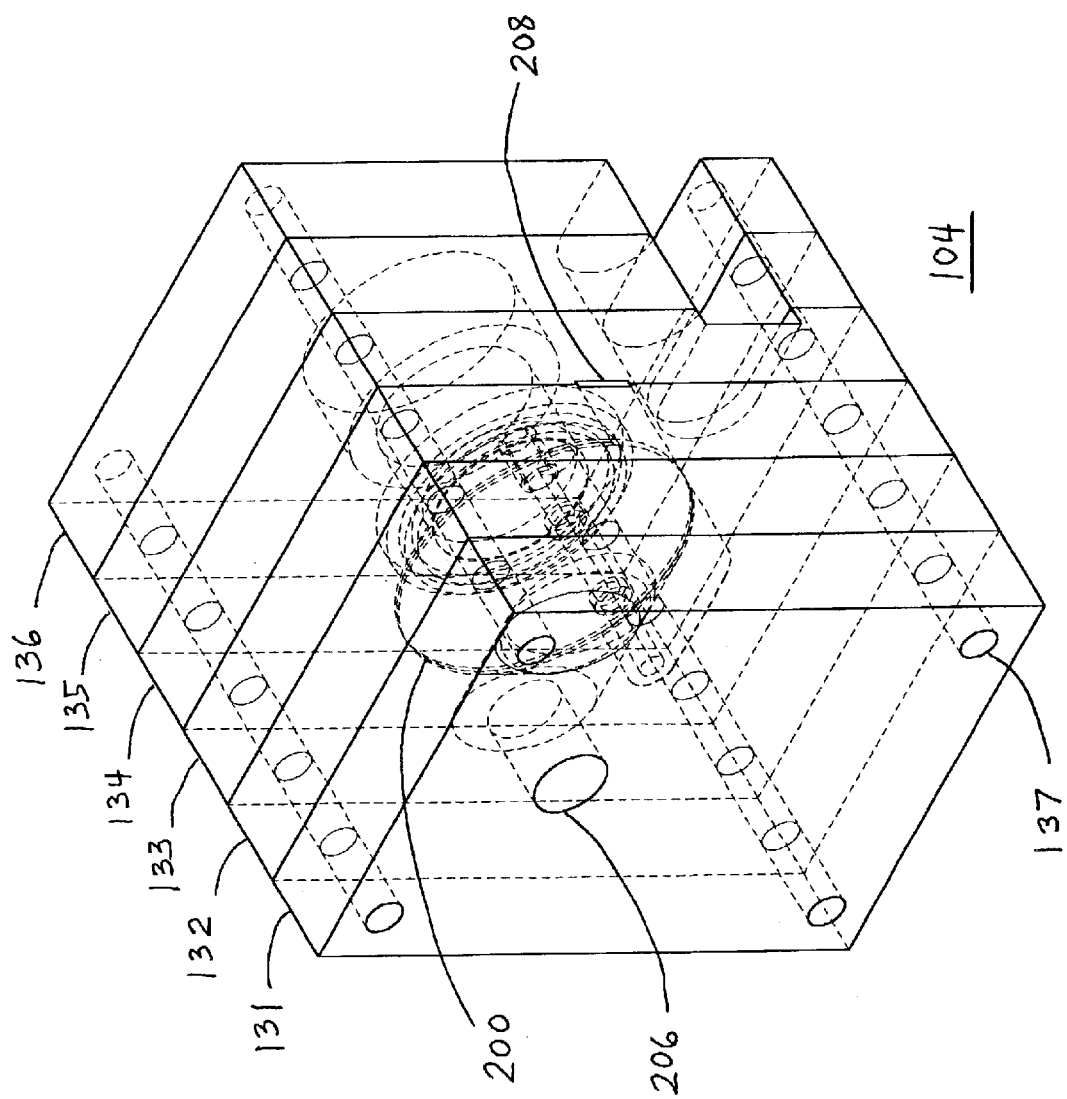
FIG. 3 is a more detailed perspective view of the feeder unit.

FIG. 3 is a more detailed perspective view of a feeder unit 104 of the dispenser 100. Shown in dotted lines in FIG. 2 is a feeder unit chamber 200 that is hollowed out within the feeder unit 104. The feeder unit chamber 200 is formed by the removal of material from at least flat plates 133 and 134. The feeder unit chamber 200 has the general shape of two adjacent cones with truncated tips. The feeder unit 104 has an opening 206 for acceptance of balls into the feeder unit chamber 200.

Figure 4:
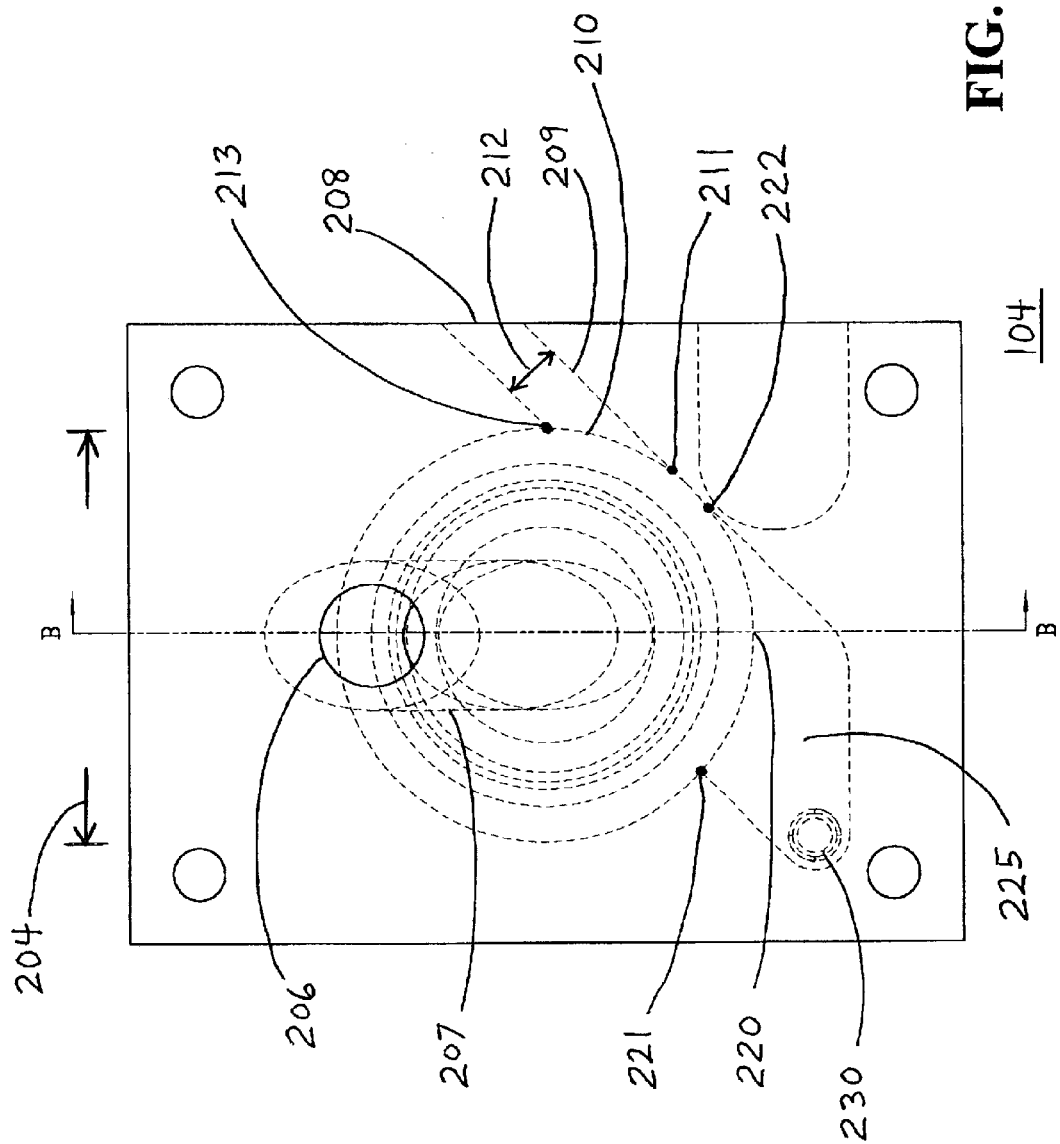
FIG. 4 is a front view of the feeder unit.

FIG. 4 is a front view of the feeder unit 104. The opening 206 is on a front side 205 of the feeder unit 104. A tubular pathway 207 extends from the opening 206 to a portion of the feeder unit chamber 200 that is nearest the front side 205. The feeder unit chamber 200 has a maximum diameter 204. Referring back to FIG. 1, connecting portion 122 extends from the opening 206 to the reservoir of balls located under the feeder unit 104. Within the connecting portion 122 is a second pathway (not shown) that transports balls from the reservoir to the feeder unit 104. Referring again to FIG. 4, the feeder unit 104 has an opening 208 for expulsion of balls from the feeder unit. An inclined pathway 209 extends from the feeder unit chamber 200 to the opening 208. The inclined pathway 209 is aligned with the intersection of the two cones-shaped sections of the feeder unit chamber 200; that is, the inclined pathway is aligned with the widest portion of the feeder unit chamber. The inclined pathway 209 forms an exit slot 210 that extends from point A 211 to point B 213 at the intersection of the two cones-shaped sections of the feeder unit chamber 200 for balls 101 leaving the feeder unit chamber 200. The inclined pathway 209 has a width 212 which is greater than a plurality of solder ball diameters. The inclined pathway 209 and has a depth (not shown) of approximately 30% greater than a solder ball diameter. The dispenser 100 in accordance with the invention is designed for balls having a nominal diameter of 30 mils (30 thousandths of an inch). Because balls having a nominal diameter of 30 mils are commercially available in tolerances of ±30%, thereby yielding balls having diameters of 21–39 mils, the depth of the inclined pathway 209 is preferably 40 thousandths of an inch. Therefore, the depth of the inclined pathway 209 is large enough for the largest expected ball 101, but too small for two of even the smallest expected balls. However, a plurality of balls 101 can travel through the inclined pathway 209 adjacent to each other in a line defining the width 212 of the inclined pathway. The inclined pathway 209 is in a same plane as the intersection of the two cone-like portions of the feeder unit chamber 200. The feeder unit chamber 200 has a bottom 220 at which there is a narrow opening (not shown) to a first void 225. The narrow opening has a length extending from point C 221 to point D 222. The narrow opening is shaped somewhat like a slit at the bottom portion of the intersection of the two cone-like portions of the feeder unit chamber 200. The first area 225 has a port 230 from which air, preferably ionized air, enters under pressure for selected periods. Alternatively, another gas is used.

Figure 5:
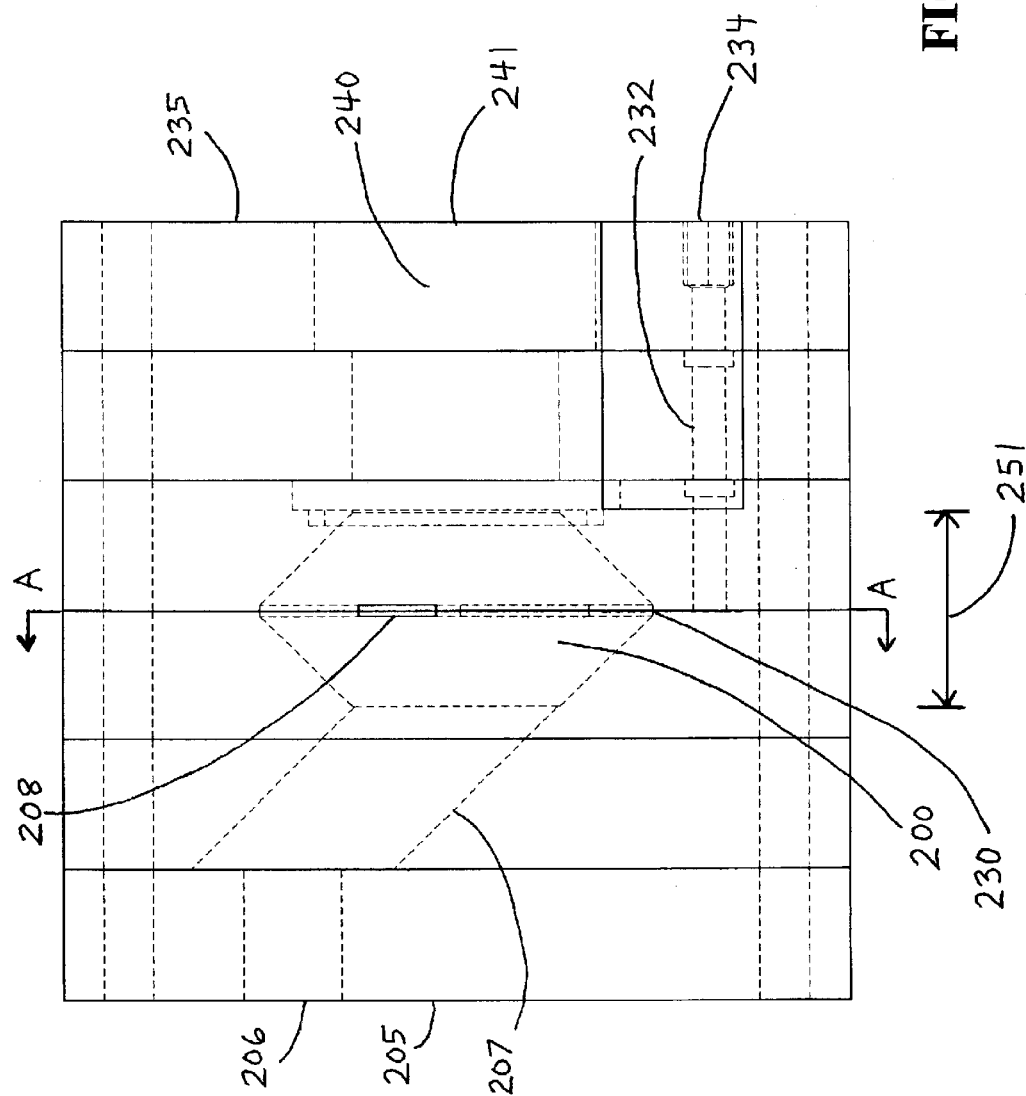
FIG. 5 is a side view of the feeder unit.

FIG. 5 is a side view of the feeder unit 104. The narrow opening at the bottom 220 of the feeder unit chamber 200 has a width of less than the diameter of one ball. The width is less than the diameter of one ball in order to prevent a ball from falling into the first area 225. A conduit 232 extends from port 230 through the feeder unit 104 to an outside port 234 on a back wall 235 of the feeder unit. The conduit 232 is connected, via the outside port 234, to a switchable source of air pressure (not shown). The switchable source of air pressure is selectively switched on producing air pressure, or switched off to a neutral state producing neither air pressure nor vacuum. For purposes of explanation, unless otherwise stated, it is assumed that the switchable source of air pressure is off.

A second void 240 extends from an opening 241 on the back wall 235 of the feeder unit 108 to a side of the feeder unit chamber 200 nearest the back wall. The feeder unit chamber 200 has a depth 251. A screen, or mesh, 242 is mounted among the second void 240 and the feeder unit chamber 200. Opening 241 is for connection to a selective switchable source of vacuum. Neither the switchable source of vacuum, nor a connection from opening 241 to the switchable source of vacuum, is shown. The mesh 242 allows the vacuum at opening 241 to reach the feeder unit chamber 108; however, the mesh has openings smaller than the diameter of a ball. Therefore, balls in the feeder unit chamber 104 will not be sucked into the void 240 when the switchable source of vacuum is turned on. The switchable source of vacuum connected to opening 241 is selectively switched on producing vacuum, or switched off to a neutral state producing neither air pressure nor vacuum. For purposes of explanation, unless otherwise stated, it is assumed that the switchable source of vacuum is off.

Figure 6:
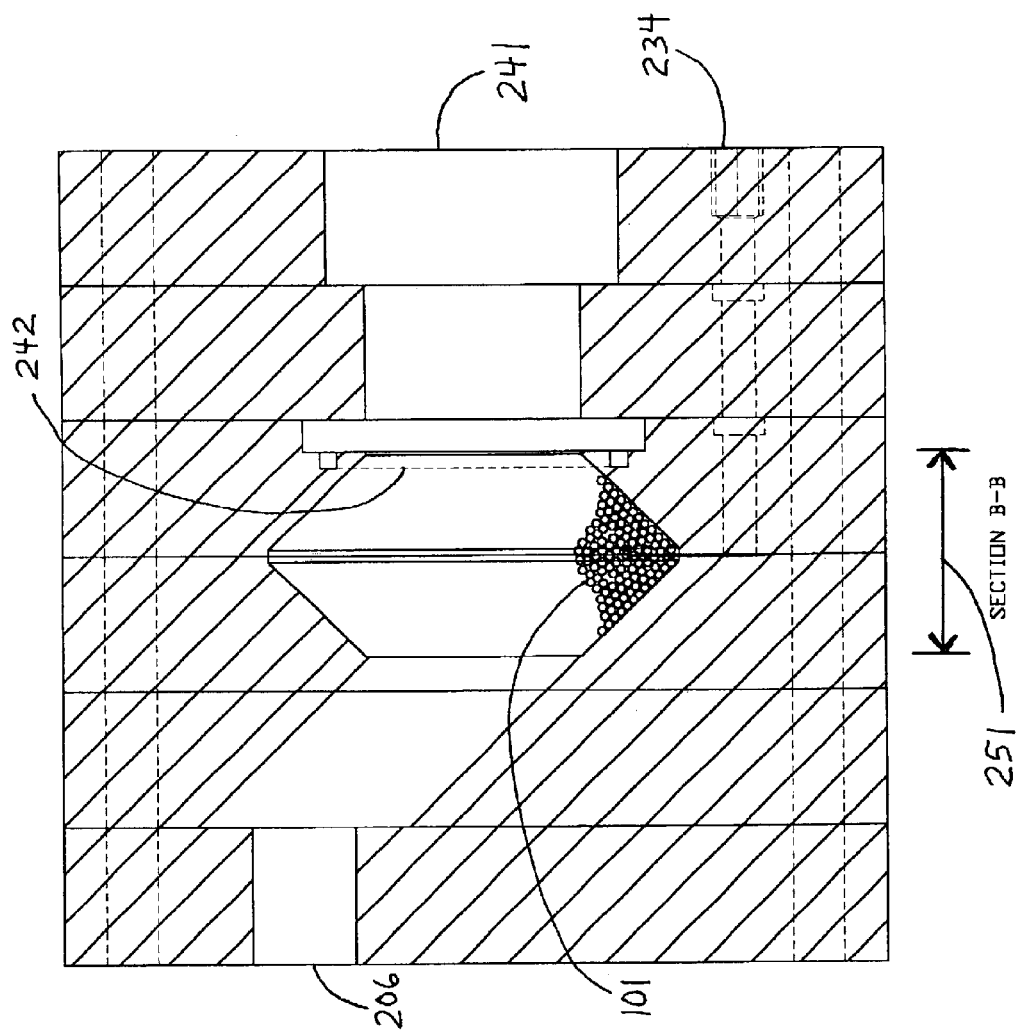
FIG. 6 is a cross-sectional view through cut-line BB of FIG. 4 showing solder balls.

FIG. 6 is a cross-sectional view through cut-line BB of FIG. 4, which shows a multiplicity of balls 101 at the bottom of the feeder unit chamber 200. This multiplicity of balls was sucked into feeder unit chamber 200 by application of vacuum at opening 241 as a result of the switchable source of vacuum being turned on. The application of vacuum caused balls in the reservoir to travel through the second tubular pathway of connecting portion 122, through opening 206 and through tubular pathway 207 prior to entering the feeder unit chamber 200. Mesh 242 stopped the balls from entering void 240. The balls 101 are stored in the reservoir in a disorganized manner, and the balls randomly enter the feeder unit chamber 200. FIG. 6 shows the balls at rest after the switchable source of vacuum connected to opening 241 is turned off The balls 101 in the feeder unit 104 are ready to load the head unit 108.

Figure 7:
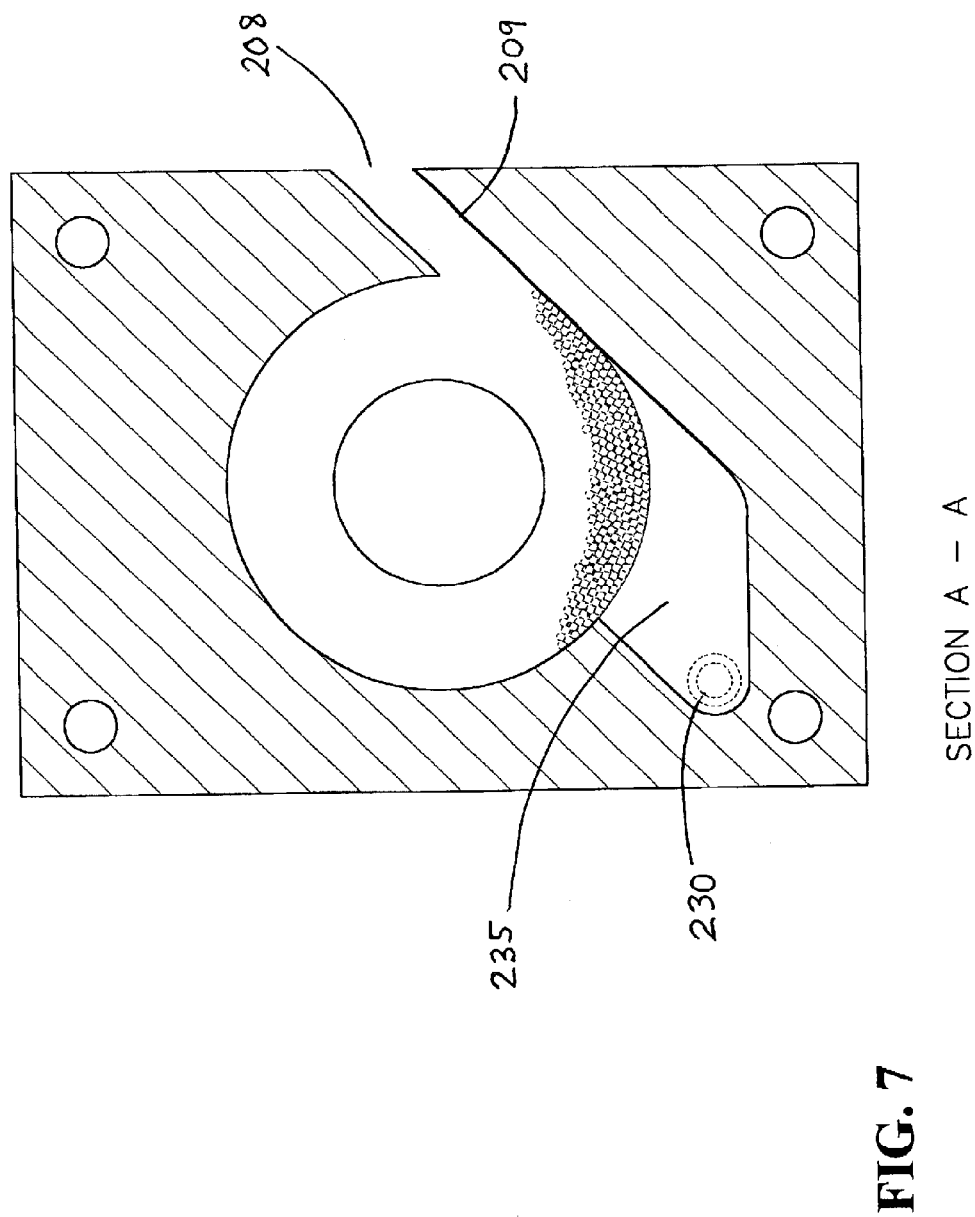
FIG. 7 is a cross-sectional view through cut-line AA of FIG. 5 showing the solder balls.

FIG. 7 is a cross-sectional view through cut-line AA of FIG. 5 showing the same multiplicity of balls 101 at rest as is shown in FIG. 6. The balls 101 in the feeder unit 104 are ready to load the head unit 108. Except for being contained within the feeder unit chamber 200, the balls 101 remain disorganized in FIGS. 6 and 7.

Figure 8:
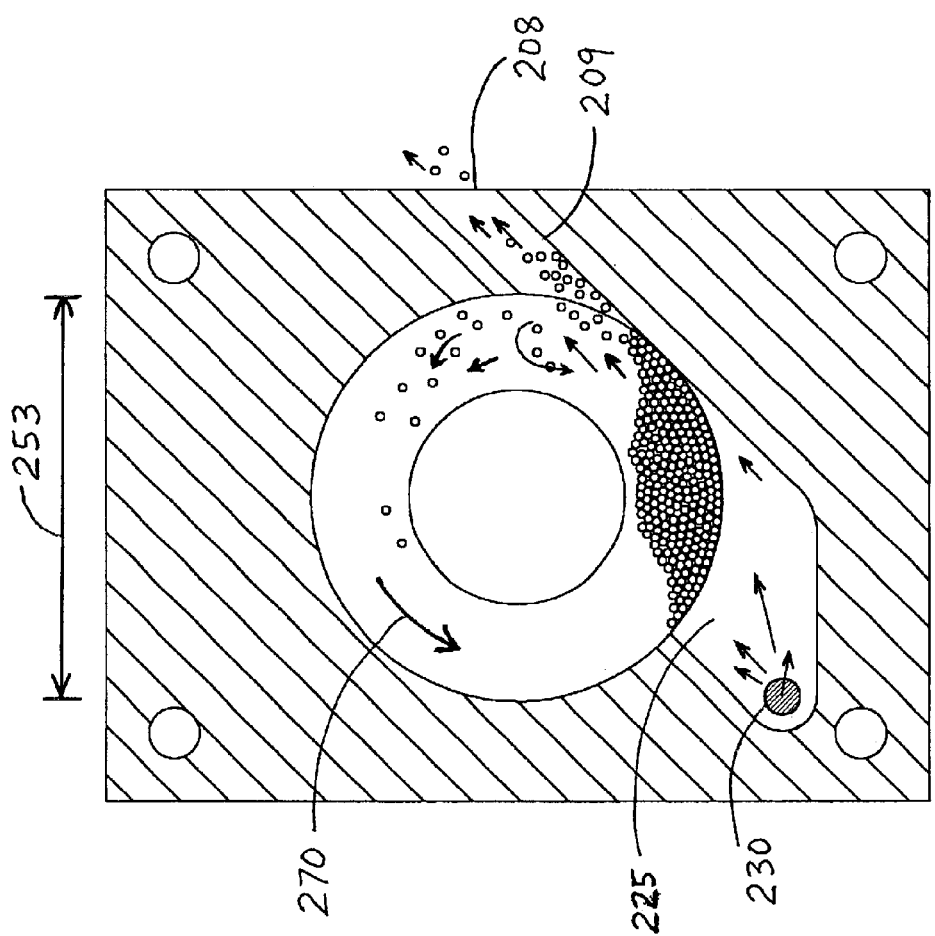
FIG. 8 is another cross-sectional view through cut-line AA of FIG. 5 showing the solder balls in motion.

FIG. 8 is another cross-sectional view through cut-line AA of FIG. 5, which shows a plurality of balls 101 in a general counterclockwise movement within the feeder unit chamber 200, as indicated by arrow 270. This movement is caused by the switchable source of air pressure being turned on, thereby producing air pressure which is conveyed via conduit 232 into first void 225, through port 230. The air pressure in conduit 232 is indicated by crosshatching at port 230. The air pressure is conveyed from first void 225 to the feeder unit chamber 200 via the narrow opening, or slit, between the two somewhat conical portions of the feeder unit chamber 200. Air pressure emanating from port 230 causes the balls 101 to move in a counter clockwise rotation. The balls 101 that have a trajectory coincident with the exit slot 210 will travel up the inclined pathway 209; the balls that do not travel up the inclined pathway, recirculate for another try. Advantageously, pileups of balls 101 at the exit slot 210 are avoided by recirculating of the balls and by gravity.

Figure 9:
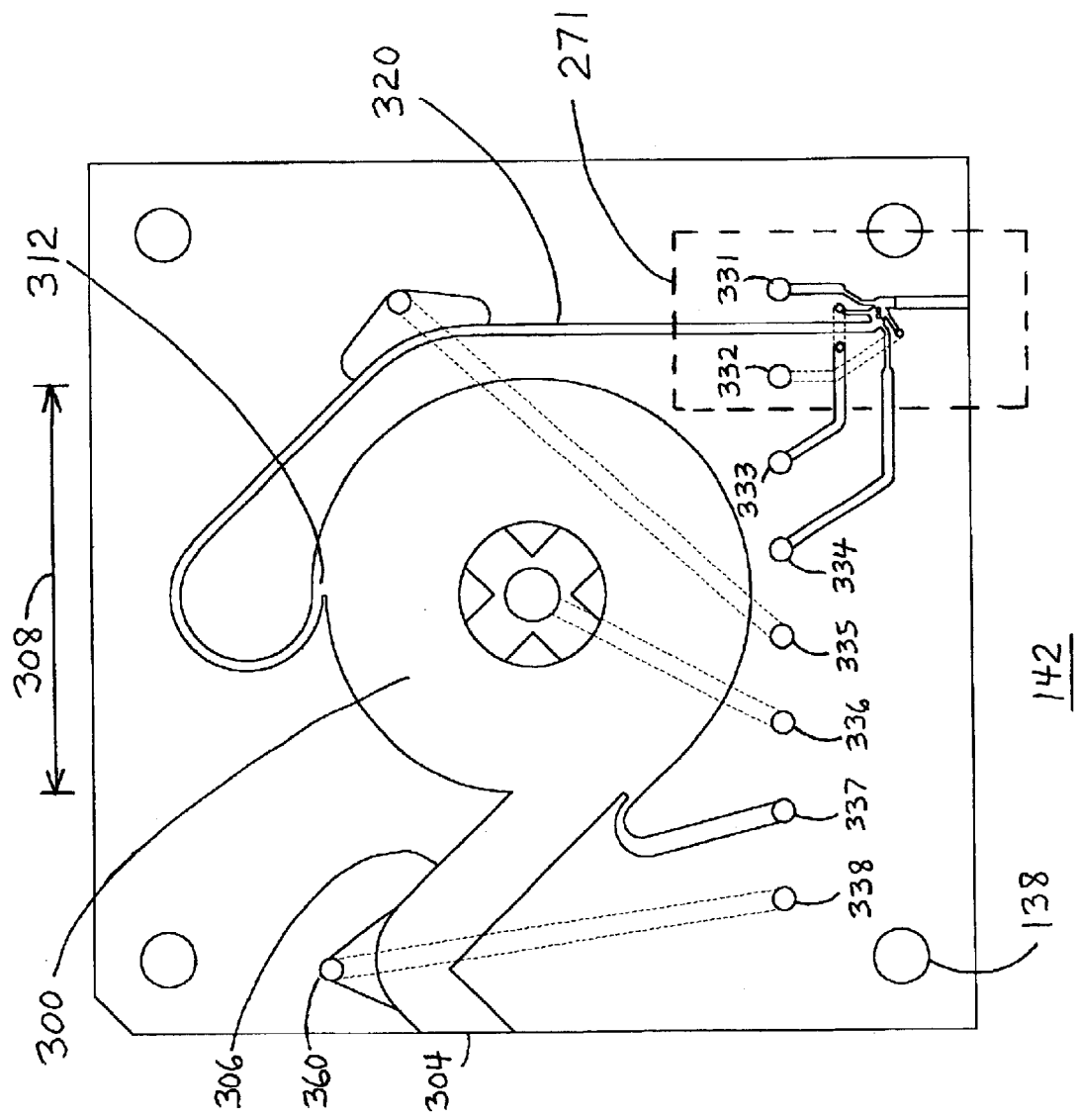
FIG. 9 is a front view of a head plate of the head unit.

FIG. 9 is a front view of a head plate 142 of the head unit 108, The head plate 142 includes a head unit chamber 300 for holding balls 101. The head unit chamber 300 is formed by a void within the head plate 142. The front view of the head unit chamber 300 has a general shape of an annular ring. The head plate 142 has an entrance 304 for balls 101. A declined ramp 306 for balls 101 extends from the entrance 304 to the head unit chamber 300. When the balls 101 are in movement, they swirl within the head unit chamber 300. The head unit chamber 300 is formed by removal of the material of the head plate 142 on the surface of the head plate facing the front plate 141. A front plate 141 and a back plate 143 form the front and back boundaries, respectively, of the head unit chamber 300. The head unit chamber 300 has an exit 312 for the balls 101 near the top of the head unit chamber 300. A buffer chute 320 has an entrance 313, and extends from the exit 312 of the head unit chamber 300 to an ejection area 271 of the head plate 142. The buffer chute 320 is a long narrow, or elongate, chamber formed by removal of the material of the head plate 142 on the surface of the head plate facing the front plate 141. The buffer chute 320 has the general shape of a curved tube or pipeline. However, the buffer chute 320 is not limited to being an elongate cylinder; it is alternatively an elongate parallelpiped. The buffer chute has a width 321 of approximately 130% of a ball diameter. The front plate 141 functions as a cover for the head unit chamber 300 and for the buffer chute 320. The head unit chamber 300 has an outer diameter 308 that is greater than one hundred times that of a diameter of a ball 101. The head unit 108 has a set of eight conduits, C1–C8, 331–338 for conducting air pressure and vacuum from a manifold 180 (see FIG. 27) to locations at the head plate 142. The conduits extend through the back plate 143. Preferably, conduits C1–C8, 331–338 have either air pressure or vacuum in them; that is, they are never switched to a neutral state. For purposes of explanation, it is assumed all conduits C1–C8, 331–338 have vacuum in them unless stated otherwise. Conduit C8 338 terminates at a location 360 near the top of the declined ramp 306. Advantageously, the declined ramp 360, buffer chute 320, head unit chamber 300 and other paths that the balls take are integrated into a single plate, such as the head plate 342, to minimize fabrication and assembly tolerances of the dispenser 100, which is critical when dispenser dimensions are for smaller balls 101. The lack of mechanical parts, such as levers, to move balls 101, allows the design of the dispenser 100 to be easily scalable for different size balls. To change the scale of the dispenser 100 in accordance with the invention, only the size of the path through which the balls 101 travel need be changed.

Figure 10:
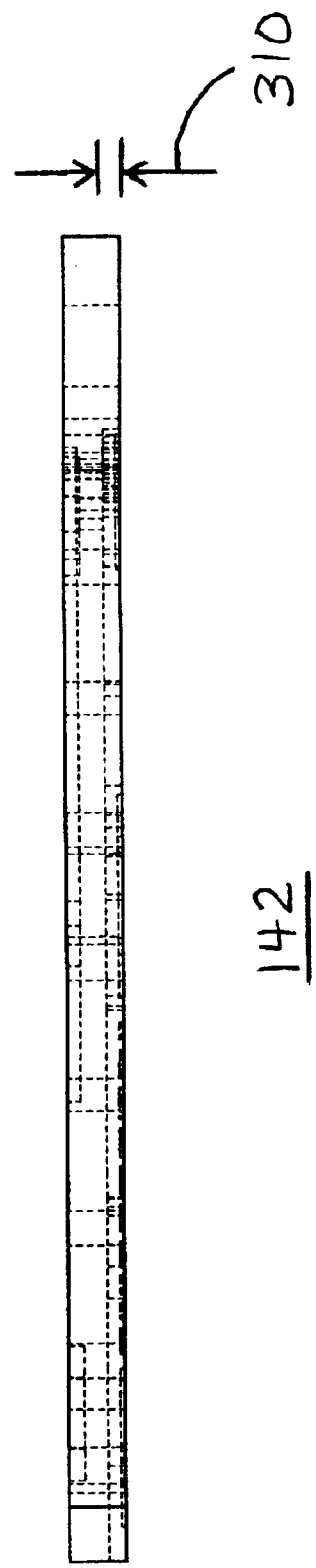
FIG. 10 is a top view of the head plate.
Figure 11:
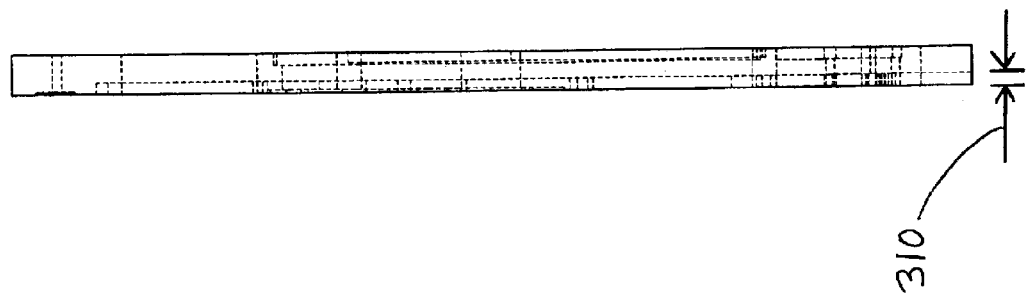
FIG. 11 is a side view of the head plate.

FIG. 10 is a top view of the head unit 108, and FIG. 11 is a side view of the head unit. The head unit chamber 300 has a depth 310 of about 30% greater than a ball diameter. Therefore, the depth 310 of the head unit chamber 300 is larger enough for the largest expected ball 101, but too small for more than one of the smallest expected balls. However, a plurality of balls 101 can fit into the head unit chamber 300 adjacent to each other radially or circumferentially.

Figure 12:
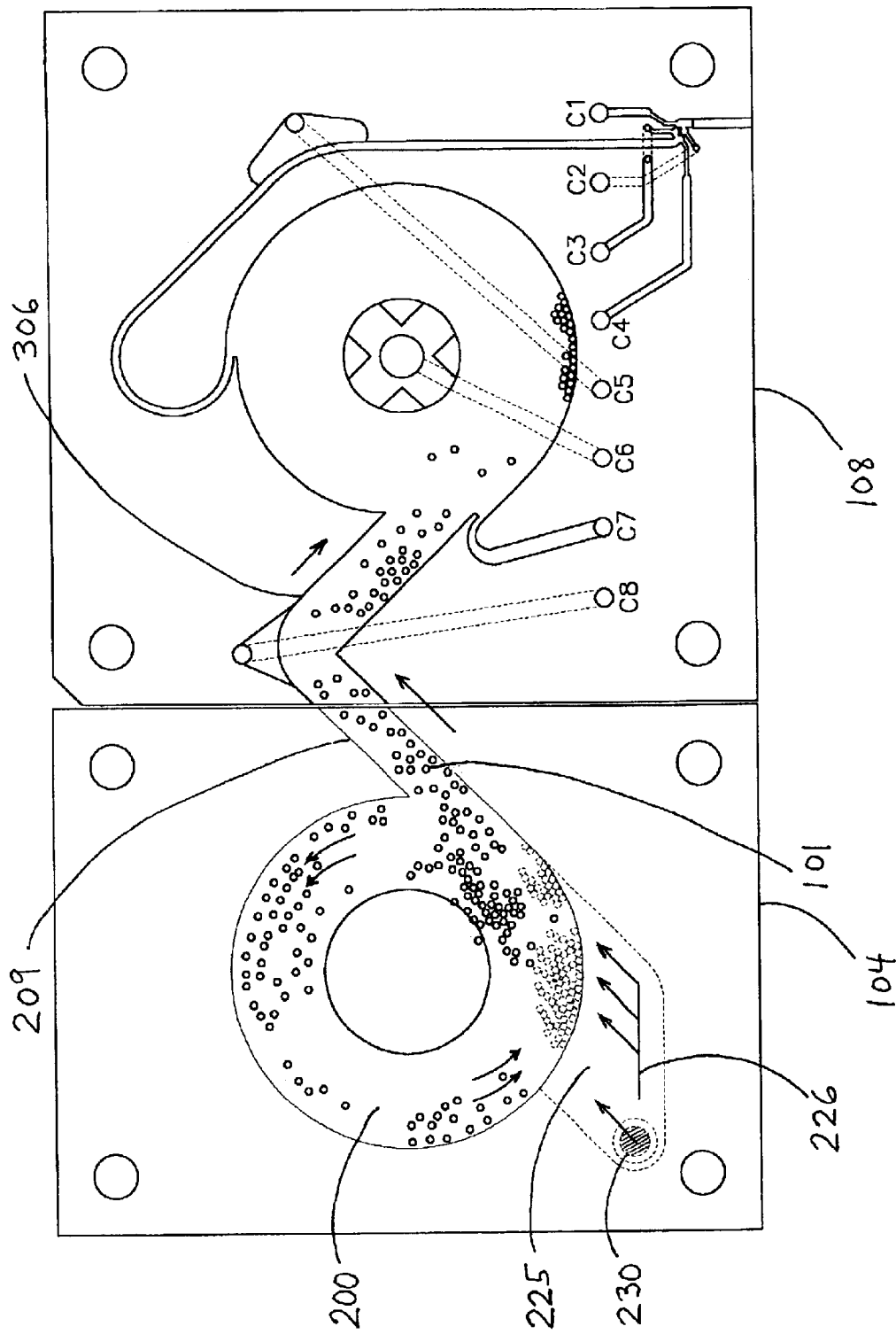
FIG. 12 shows the feeder unit and the head unit and a multiplicity of solder balls moving from the feeder unit to the head unit.
Figure 13:
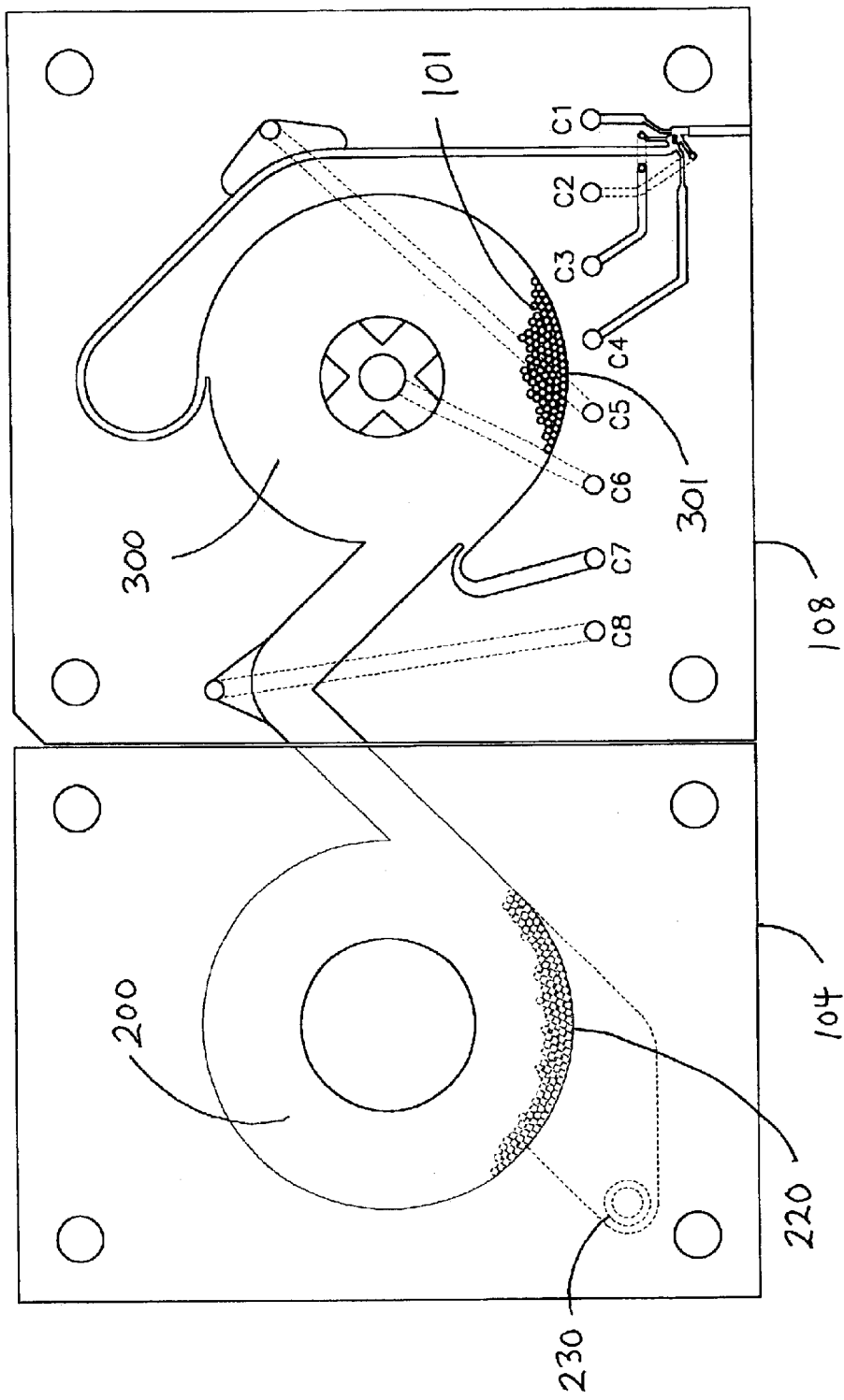
FIG. 13 shows the feeder unit and the head unit and a multiplicity of solder balls in a head unit chamber of the head unit.
Figure 14:
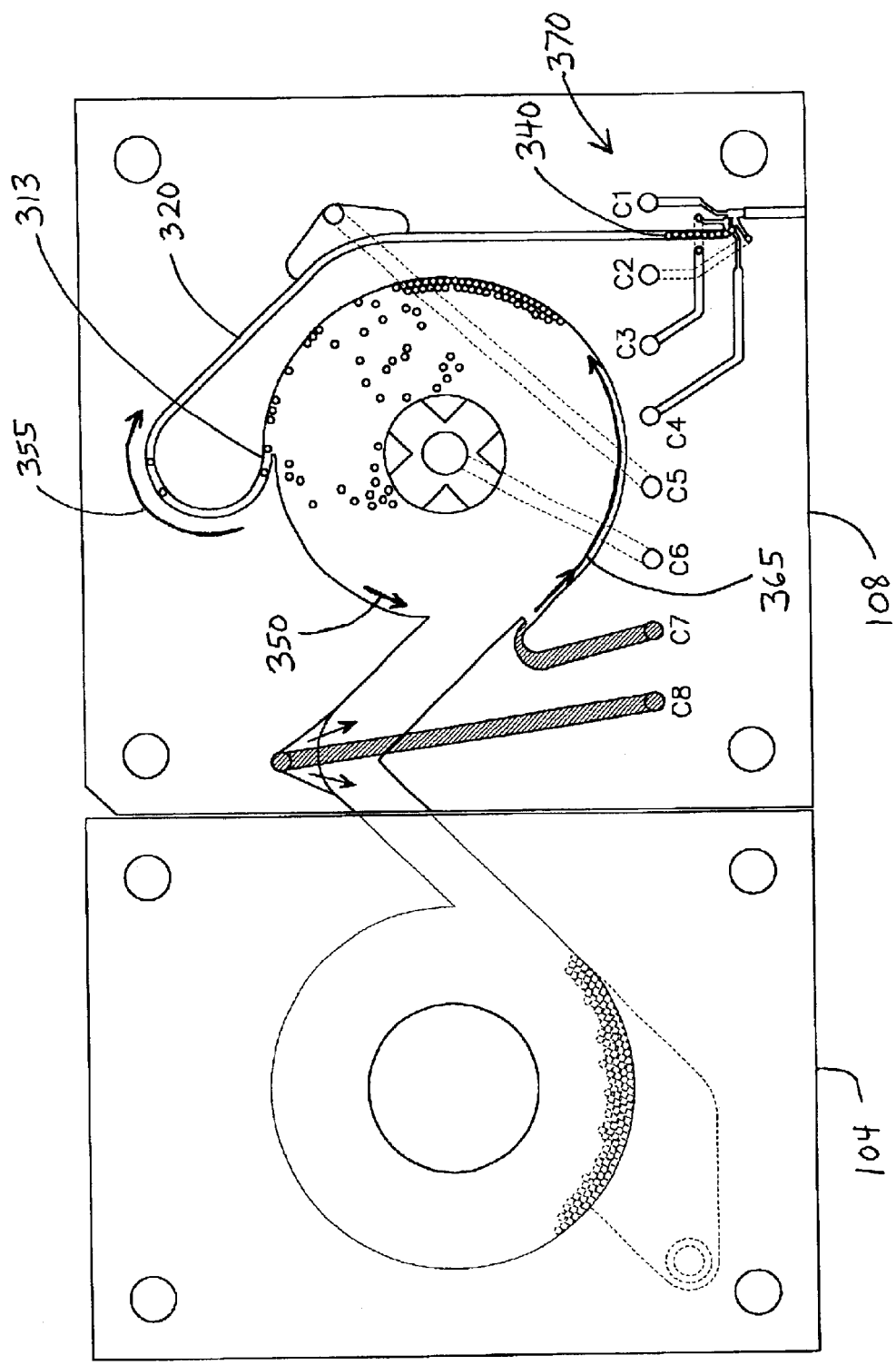
FIG. 14 shows the feeder unit and the head unit and a multiplicity of solder balls swirling in the head unit chamber.

FIGS. 12-14 show the connection between the feeder unit 104 and the head unit 108, and demonstrates a sequence of steps for loading the head unit 108 with balls 101 from the feeder unit 104. The feeder unit 104 is attached to the head unit 108 such that the opening 208 of the feeder unit 104 connects with the entrance 304 at the head plate 142 of the head unit. It should be noted that both the maximum diameter 204 of the conical-like portions of the feeder unit chamber 200 and the depth 251 of the feeder unit chamber have a size of greater than one hundred ball diameters. As a result, the feeder unit chamber 200 is substantially larger in size than a ball diameter, by a factor of at least one hundred, in all three dimensions. Therefore, balls 101 in the feeder unit chamber 200 can move in all three directions.

It is important to note that while the outer diameter 308 of the head unit chamber 300 has a size of greater than one hundred ball diameters, the depth 310 of the head unit chamber has a size of only 130% of a ball diameter. Therefore, the head unit chamber 300 is substantially larger than a ball diameter, by a factor of at least one hundred, in only two of the three dimensions. Consequently, balls 101 in the head unit chamber 300 can only move in two directions in any substantial amount. As a result, balls 101 that have traveled from the feeder unit chamber 200 to the head unit chamber 300 have advantageously had their freedom of movement reduced from three dimensions to virtually two dimensions. Accordingly, at least some of the multiplicity of balls 101 within the dispenser 100 have become more organized.

FIG. 12 shows the head unit chamber 300 receiving balls 101. A multiplicity of balls 101 that were originally at rest at the bottom of the feeder unit chamber 200 are indicated by balls drawn in dotted lines. Thereafter, air is emitted from port 230 of the feeder unit 104, as indicated by the crosshatching of port 230, thereby producing an air jet 226 emanating from area 225, through the narrow opening, and into the bottom 220 of the feeder unit chamber 200. A vacuum is present in conduit C8 338. FIG. 12 shows the feeder unit 104 and the head unit 108 and a single layer of balls 101 moving from the feeder unit 104 to the head unit 108 through the inclined pathway 209 of the feeder unit 104 and the, declined ramp 306 of the head unit 108. The vacuum in conduit C8 338 and the air pressure in conduit 232 cooperate to cause the balls 101 to travel from the feeder unit chamber 200 to the head unit chamber 300. The balls in the inclined pathway 209 of the feeder unit 104 and the declined ramp 306 of the head unit 108 are in a single layer because the depths of the inclined pathway and declined ramp are less than the diameters of two balls.

FIG. 13 shows the feeder unit 104 and the head unit 108 and a plurality of balls 101 at the bottom 301 of the head unit chamber 300. Air is no longer being emitted from port 230 of the feeder unit 104 because the air pressure in conduit 232 has been switched off. The vacuum in conduit C8 338 remains. Balls at the bottom 220 of the feeder unit chamber 200 are shown in dotted lines to indicate whence the balls came. FIG. 13 shows an idealized operation by which all the balls that had been in the feeder unit chamber 200 are transferred to the head unit chamber 300. However, it is not necessary for the proper operation of the dispenser 100 that all the balls in the feeder unit chamber 200 be transferred to the head unit chamber 300—only some of the balls need be transferred. The balls 101 in the head unit 108 are at rest and are ready to load the buffer chute 320. FIG. 13 shows a ready state of the dispenser 100. The dispenser 100 is at the beginning of an ejection cycle.

FIG. 14 shows the feeder unit 104 and the head unit 108 and a plurality of balls 101 swirling in the head unit chamber 300. In FIGS. 14-25, air pressure in one or more of the conduits C1–C8, 331–338 is indicated by crosshatching; conduits having vacuum do not have crosshatching. FIG. 14 shows the buffer chute 320 being filled with balls 101. Port C7 337 is pressurized, thereby creating an air jet 365 that moves the balls 101 in the head unit chamber 300 in a counter clockwise rotation as indicated by arrow 350. Balls that have a trajectory coincident with the entrance 313 of the buffer chute 320 will enter the buffer chute as indicated by arrow 355. Balls that do not enter the buffer chute 320, recirculate within the head unit chamber 300 and may enter the buffer chute later. Pileups at the entrance 313 of the buffer chute 320 are avoided by recirculating of the balls 101 and by gravity. Port C8 338 is pressurized to clear the entrance 304 to the head unit 108 and to prevent the circulating balls 101 in the head unit chamber 300 from back-flowing into the feeder unit chamber 200. A single vertical column, or stack, 340 of balls is shown at the bottom of the buffer chute 320, having traveled there from the head unit chamber 300. The bottom of the buffer chute 320 connects with a pneumatic singulator 370 in the ejection area 271.

It is important to note that while the length of the buffer chute 320 has a size of greater than one hundred ball diameters, the width 321 of the buffer chute has a size of only 130% of a ball diameter. Therefore, the buffer chute 320 is substantially larger than a ball diameter, by a factor of at least one hundred, in only one of the three dimensions. Consequently, balls 101 in the buffer chute 320 can only move in one direction in any substantial amount. As a result, balls 101 that have traveled from the head unit chamber 300 to the buffer chute 320 have advantageously had their freedom of movement reduced from two dimensions to virtually one dimension. Accordingly, a plurality of the at least some of the multiplicity of balls 101 within the dispenser 100 have become still more organized.

Figure 15:
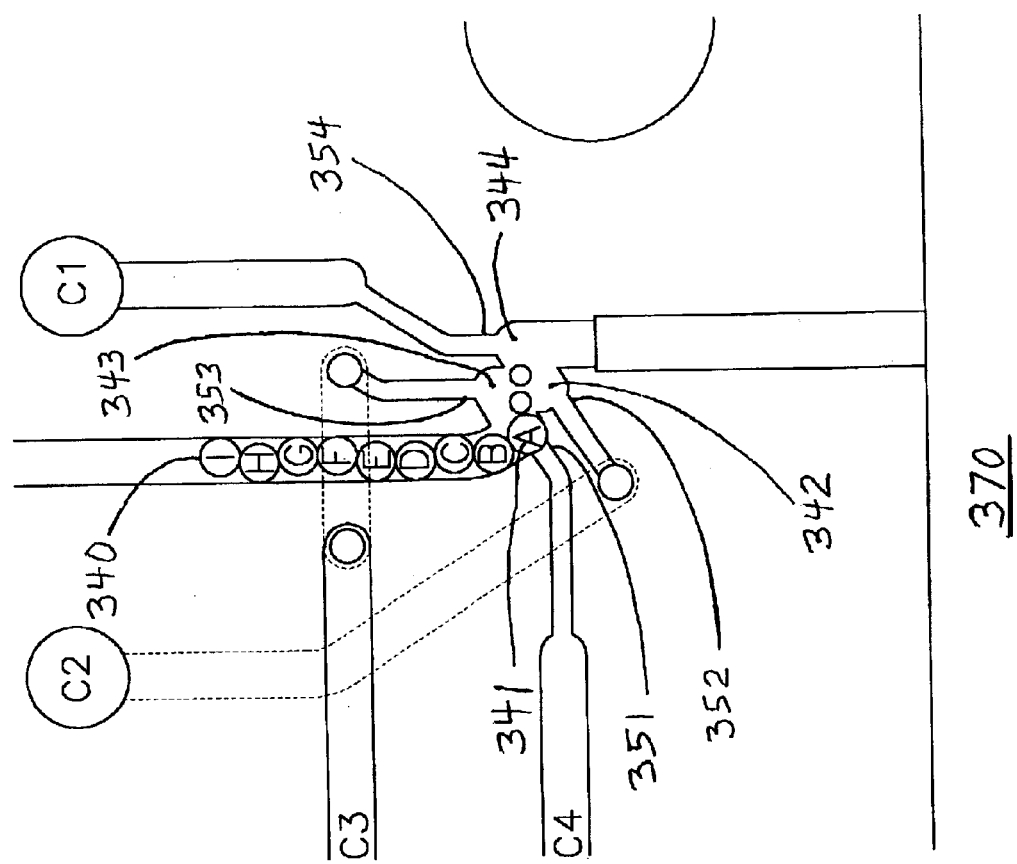
FIGS. 15-25 are enlarged views of an ejection area of FIG. 12 showing a pneumatic singulator at various stages of dispensing.

FIGS. 15-25 are enlarged views of the ejection area 271 of the head unit 108 showing the pneumatic singulator 370 of the dispenser 100 at various stages of dispensing balls 101. Referring now specially to FIG. 15, the pneumatic singulator 370 comprises a pathway for balls with a plurality of mechanical stops, or stops. Preferably, there are four stops 341–344. Advantageously, the pathway of the pneumatic singulator 370 bends at least 45° at each stop 341–344. At each stop 341–344 is an orifice 351–354 of one of the conduits C1–C4, 331–334. The pathway, which is part of the operating channel, or channel for ball travel, of the dispenser 100, is sized to accept only one ball 101 at a time. Within the pneumatic singulator 370, the balls 101 pass any one point on the pathway serially. A ball 101 traversing the pneumatic singulator 370 advantageously pauses at each stop 341–344, partly as a result of encountering a wall of the pathway within the pneumatic singulator 370 and partly as a result of selective application of air pressure and vacuum within each of the conduits 331–334, in accordance with the invention.

FIGS. 15-25 shows a sequence of steps for loading the pneumatic singulator 370 and for dispensing one ball 101 at a time, using, as an example, only nine balls in the buffer chute 320. In actual operation, the buffer chute 320 has many more than nine balls in it. For explanatory purposes, the balls are labeled A–I. FIG. 15 shows balls A–I at the bottom of the buffer chute 320 that are ready to be loaded into the pneumatic dispenser 370. Conduit C5, 335 (see FIG. 14) is pressurized to help in moving balls 101 to the bottom of the buffer chute 320. By pressurizing conduit C5, 335, there is a downward force (in addition to gravity) on the balls at the bottom of the buffer chute 320. Ball A is held in position by vacuum on conduit C4, 334 and by a first stop 341.

Figure 16:
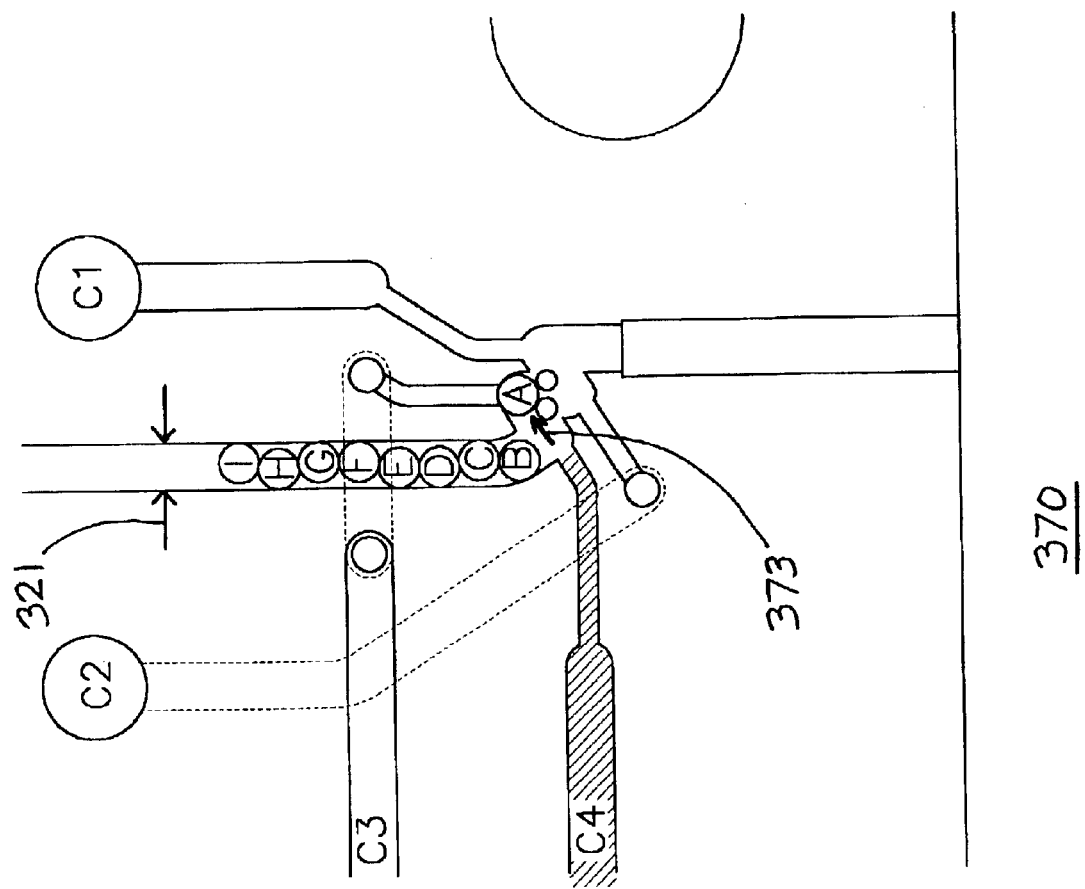

In FIG. 16, conduit C3, 333 has become vacuum and conduit C4, 334 has become pressurized. The air emanating conduit C4, 334, in cooperation with the vacuum condition of conduit C3, 333, causes ball A to move from the first stop 341 to the second stop 342, and, as a result, ball A has changed course by about 90°. Ball A is held in position by vacuum on conduit C3, 333 and by the second stop 342.

Figure 17:
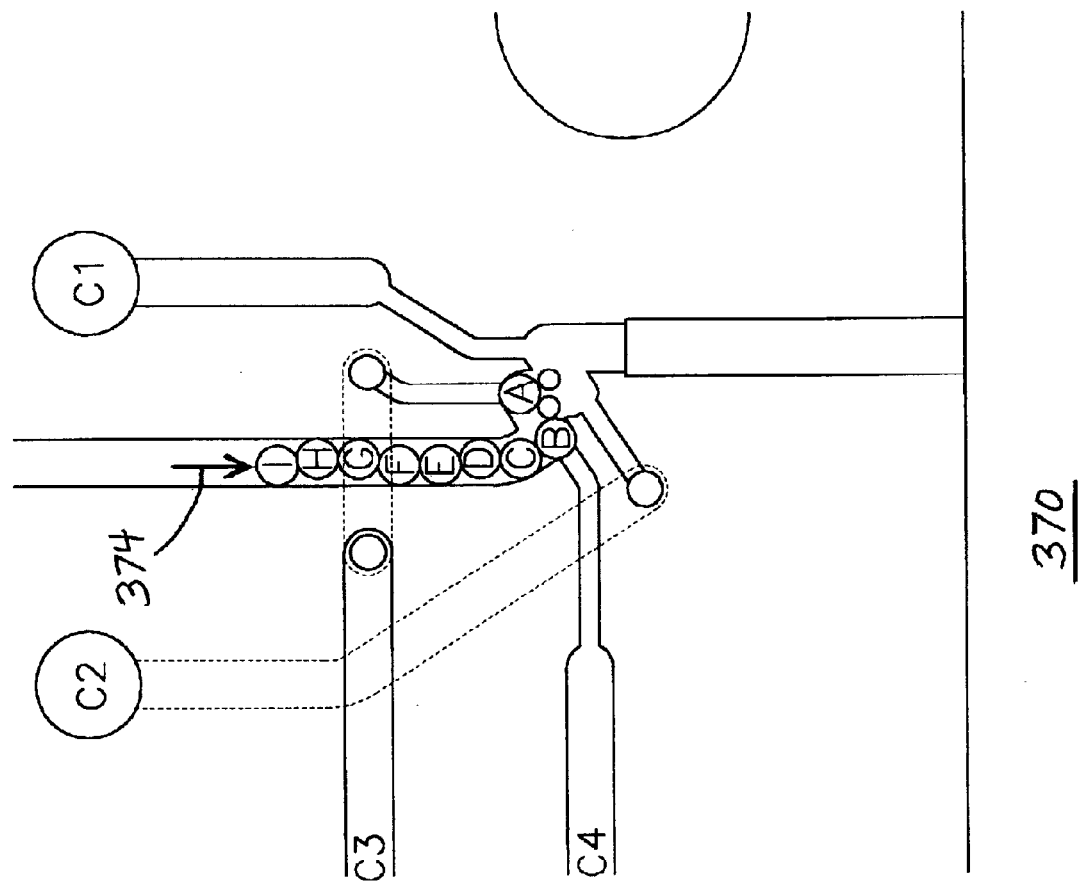

In FIG. 17, conduit C4, 334 is returned to the vacuum condition, the stack 340 of balls B–I moves down one position, as indicated by arrow 374, as a result of the vacuum on conduit C4, with help from gravity and from the pressure from conduit C5, 335. Ball B is held in position by the vacuum on conduit C4, 334 and by the first stop 341.

Figure 18:
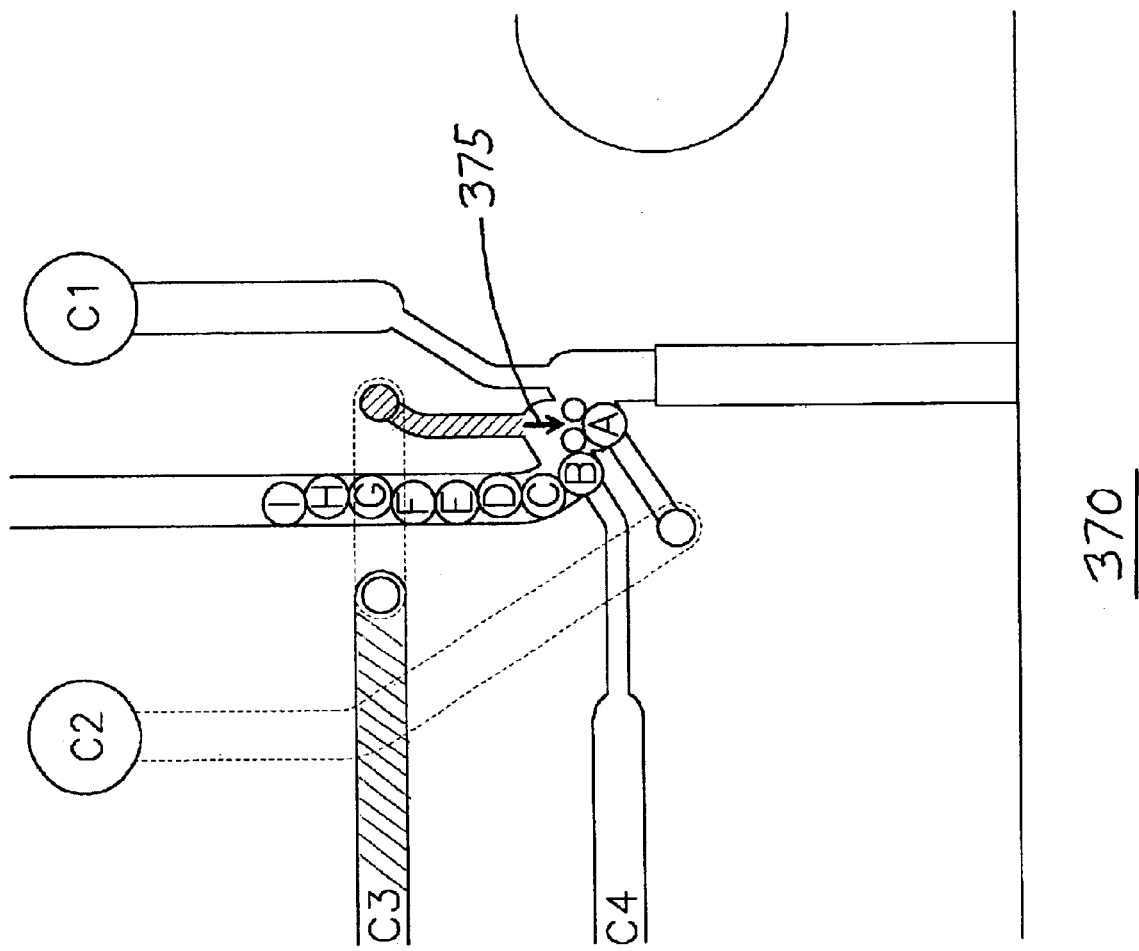

In FIG. 18, conduit C3, 333 becoming pressurized, in cooperation with the vacuum at conduit C2, 332 causes ball A to move from the second stop 342 to a third stop 343, as indicated by arrow 375. As a result of moving from the second stop 342 to the third stop 343, ball A has changed course by about 135°. Ball A is held in position by the vacuum on C3 and by the third stop 343.

Figure 19:
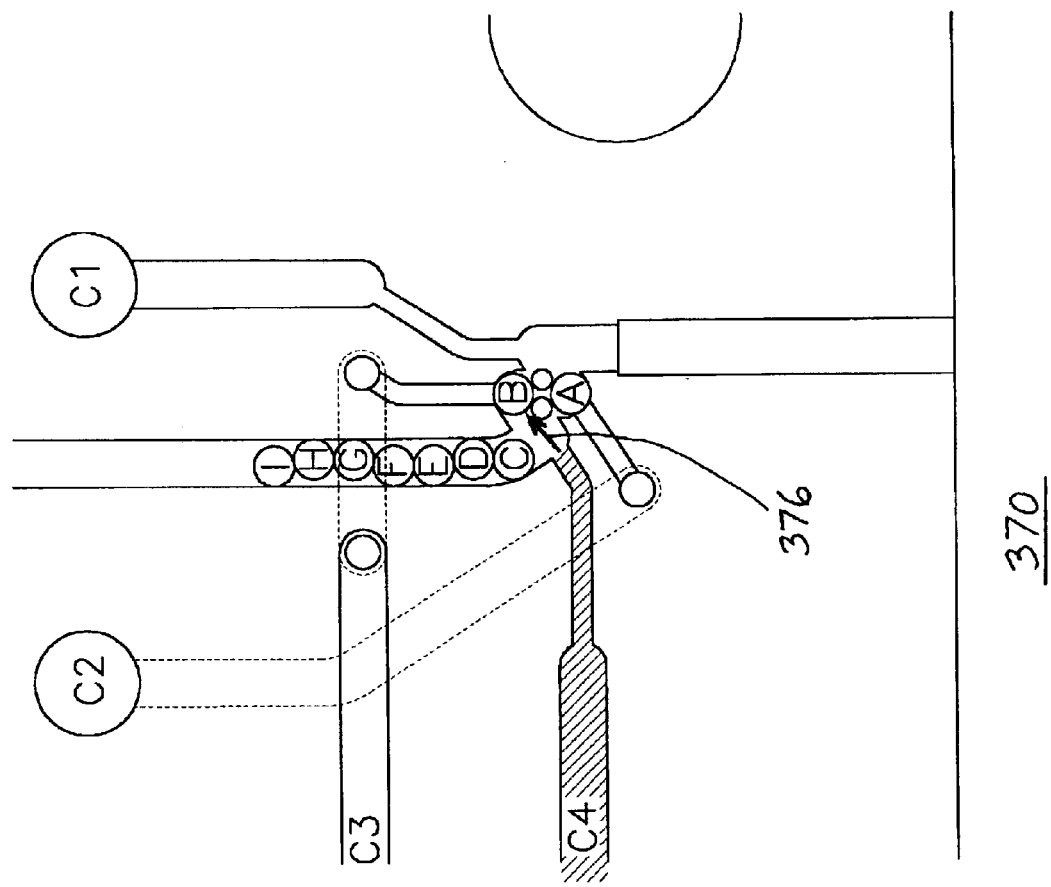

In FIG. 19, conduit C3, 333 is returned to the vacuum condition, and conduit C4, 334 is pressurized, which combine to move ball B from the first stop 341 to the second stop 342, as indicated by arrow 376. Ball B is held in position by the vacuum at conduit C3, 333 and by the second stop 342.

Figure 20:
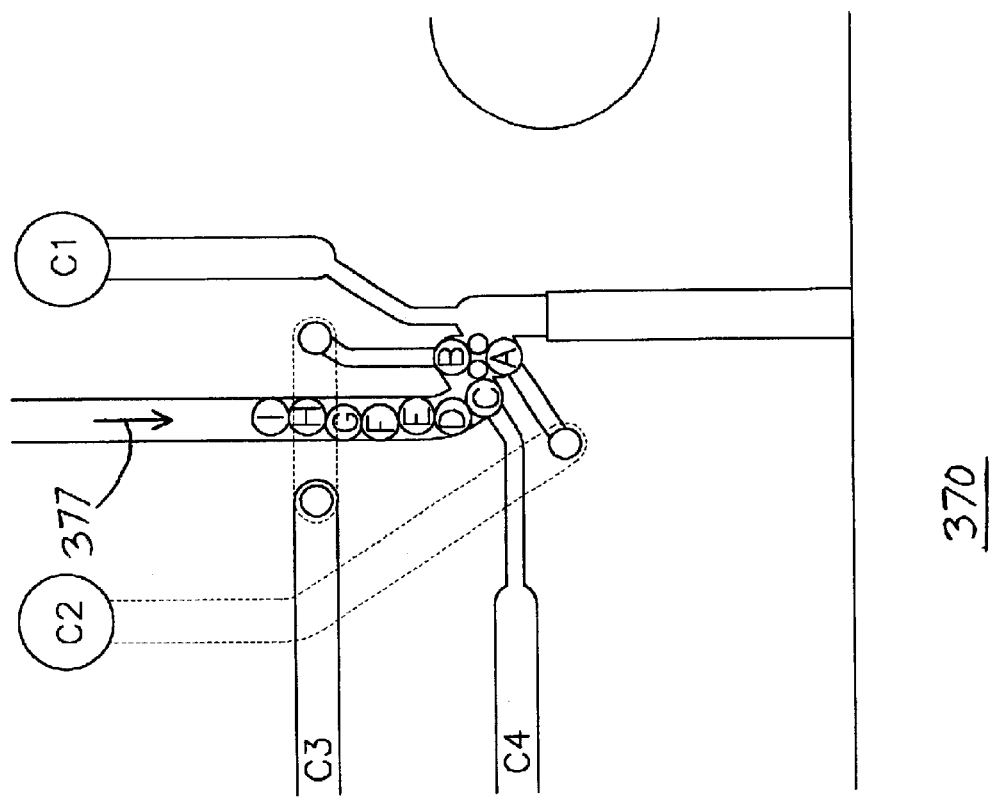

In FIG. 20, conduit C4, 334 is returned to the vacuum condition, which, in conjunction with gravity, causes balls C–I to move down one position, as indicated by arrow 377. Ball C is held in position by the vacuum on conduit C4, 334 and by the first stop 341.

Figure 21:
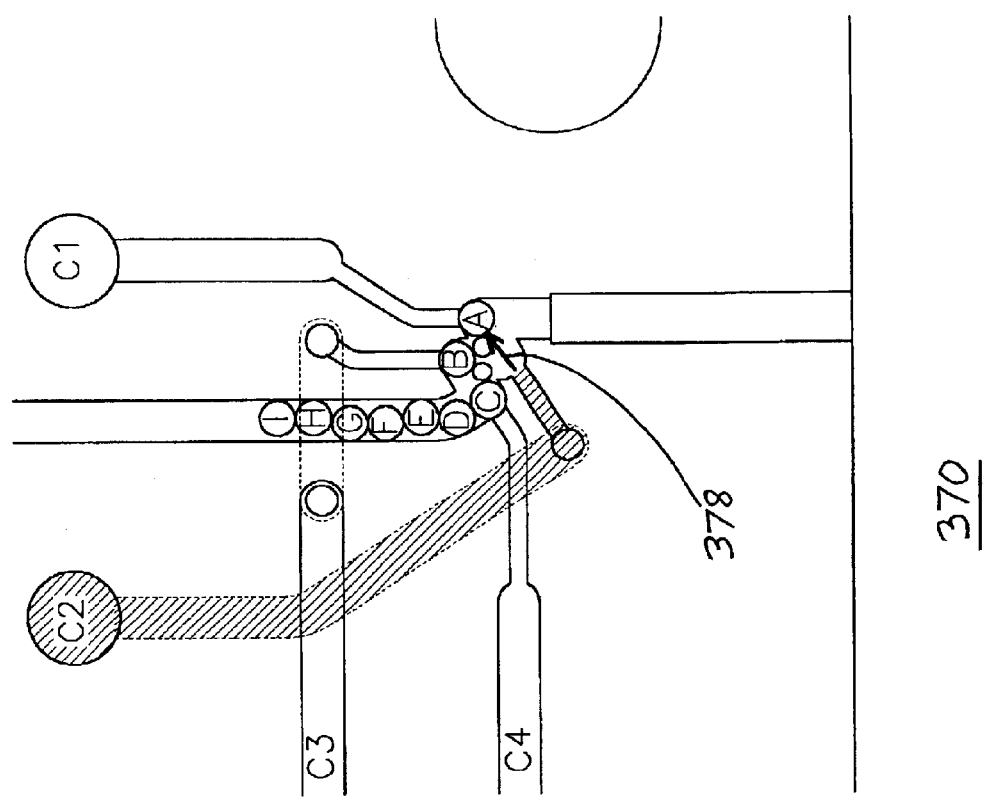

In FIG. 21, conduit C2, 332 is pressurized and conduit C1, 331 is changed to vacuum condition, which, together, cause ball A to move from the third stop 343 to a fourth stop 344, as indicated by arrow 378. As a result of moving from the third stop 343 to the fourth stop 344, ball A has changed course by about 135°. Ball A is held in position by the vacuum condition on conduit C1, 331 and by the fourth stop 344.

Figure 22:
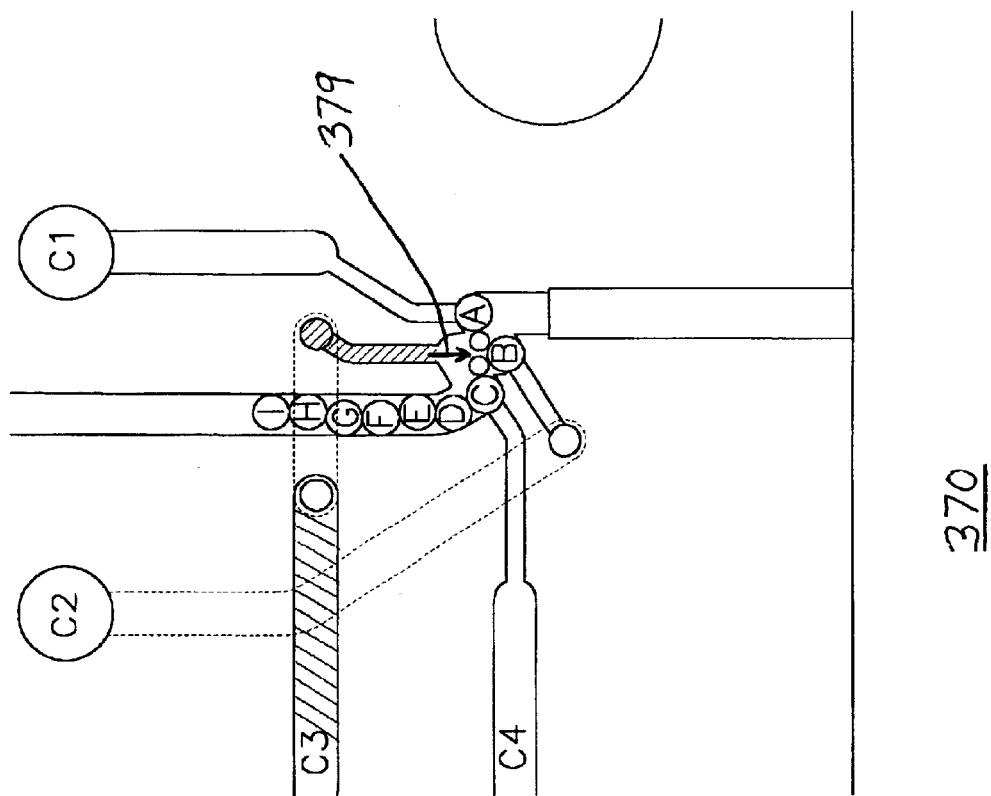

In FIG. 22, conduit C2, 332 is returned to the vacuum condition. Conduit C3, 333 is pressurized. Ball B moves from the second stop 342 to the third stop 343, as indicated by arrow 379. Ball B is held in position by the vacuum condition on conduit C2, 332 and by the third stop 343.

Figure 23:
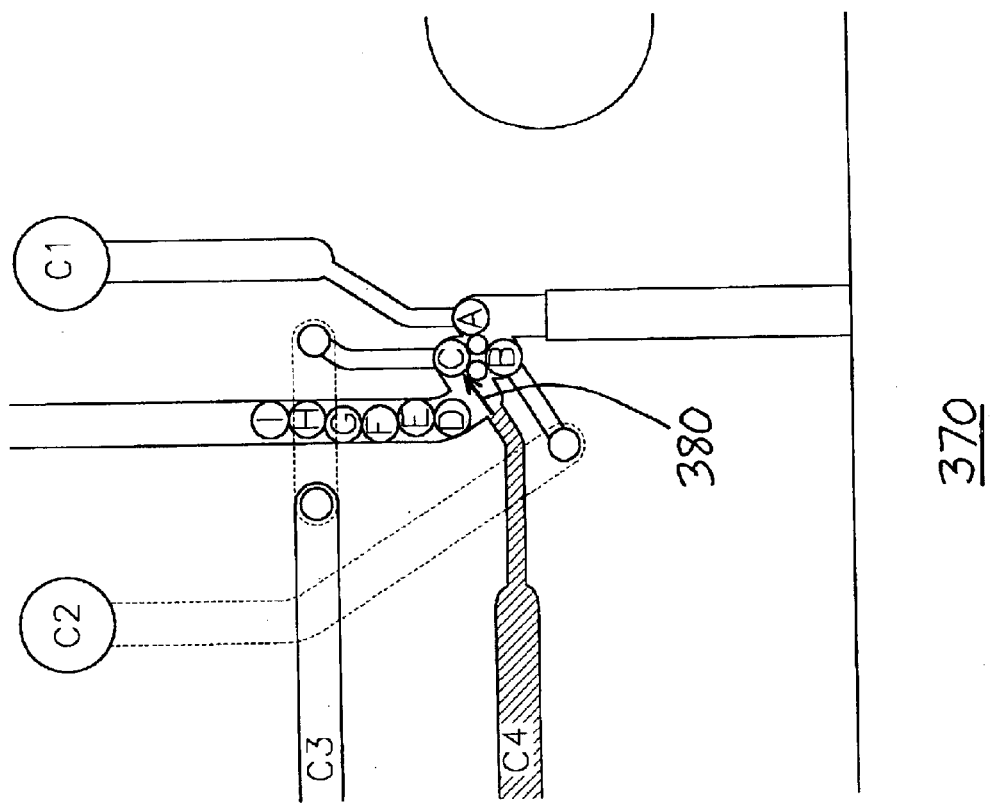

In FIG. 23, conduit C3, 333 is returned to the vacuum condition. Conduit C4, 334 is pressurized. Ball C moves from the first stop 341 to the second stop 342, as indicated by arrow 380. Ball C is held in position by the vacuum condition on conduit C3, 333 and by the second stop 342.

Figure 24:
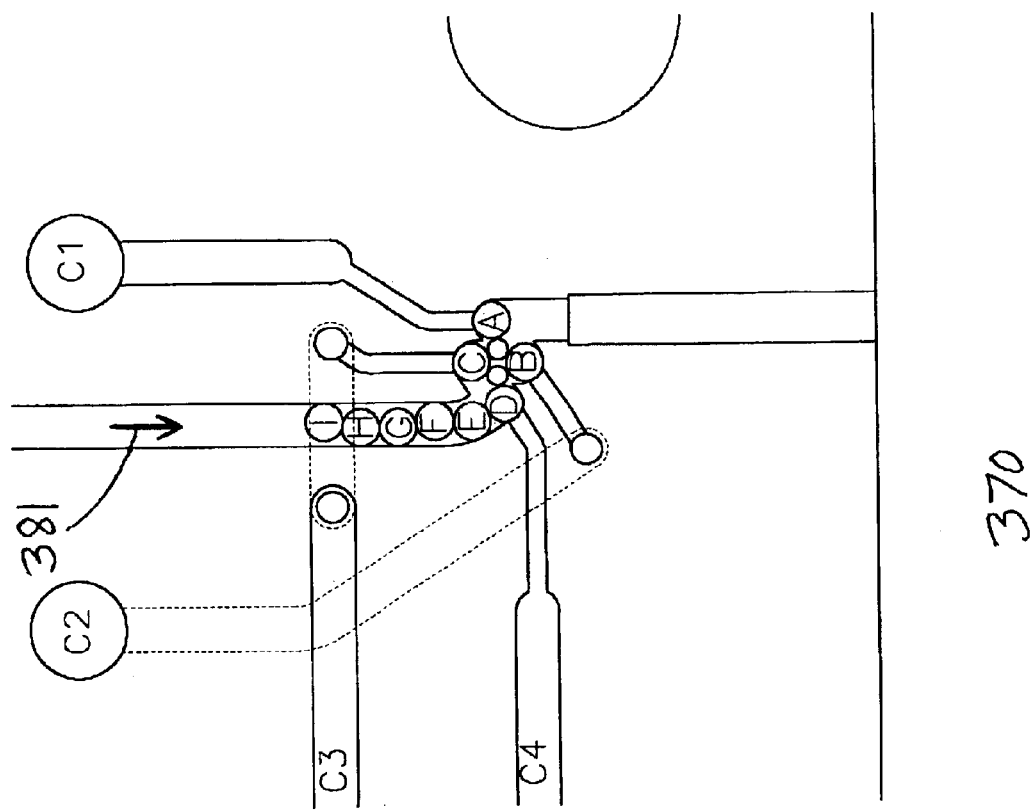

In FIG. 24, conduit C4, 334 is returned to the vacuum condition, which, in conjunction with gravity, causes the stack 340 of balls D–I to move down one position, as indicated by arrow 381. Ball D is held in position by the vacuum on conduit C4, 334 and by the first stop 341.

Figure 25:
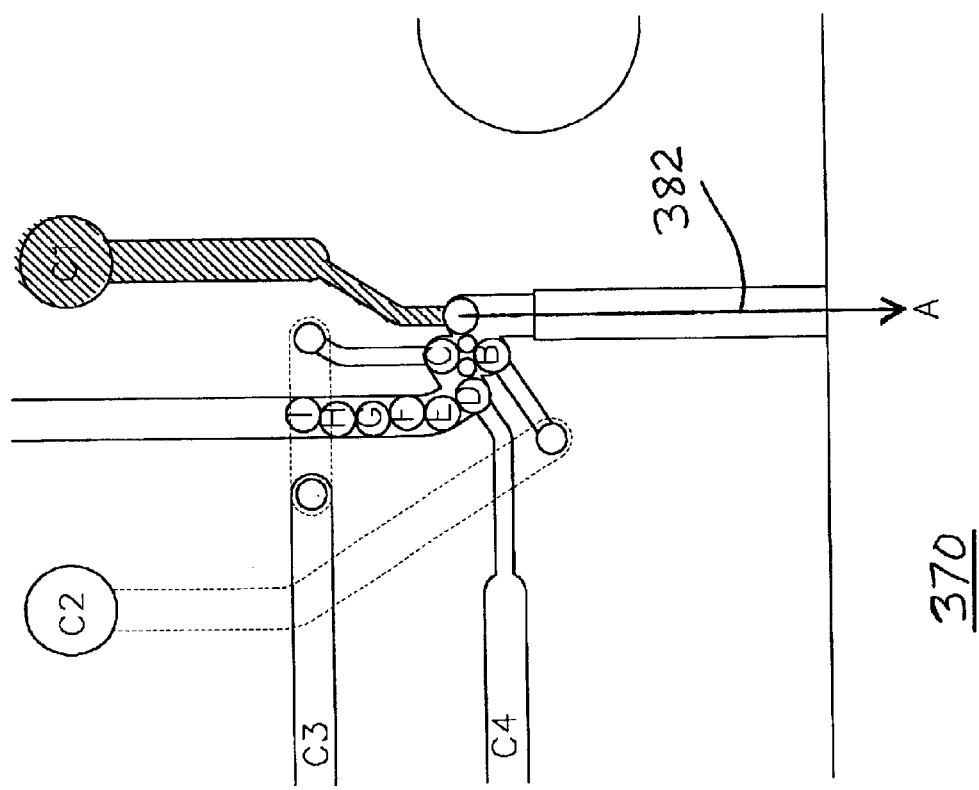

In FIG. 25, conduit C1, 331 is pressurized to move ball A from the fourth stop 344, thereby causing the ball 101 to be ejected (as indicated by arrow 382) from the dispenser 100 to the target device such as the BGA 120 shown in FIG. 1. As a result of moving from the fourth stop 344 to being ejected, ball A has changed course by about 135°. The fourth stop 344 is alternatively a moving dispenser tube, which moves vertically in a sewing machine fashion, and which ejects a ball 101 from the fourth stop when the fourth stop in a lowest position, thereby being closest to the target device.

Although FIGS. 15-25 describe steps of the initial loading of the pneumatic singulator 370 until the first ejection of a ball 101, it is important to realize that during continuous operation the pneumatic singulator is both being loaded and ejecting balls at the same time.

Table 1 shows the state of each conduit C1–C8, 331–338, during each step of continuous operation of the dispenser 100.

TABLE 1

| STEP | | CONDUIT | | | | | | | |
|---|---|---|---|---|---|---|---|---|---|
| | | 1 | 2 | 3 | 4 | 5 | 6 | 7 | 8 |
| 1 | FIG. 15 | V | V | V | V | P | V | V | V |
| 2 | | V | P | V | V | P | V | V | V |
| 3 | | V | V | P | V | P | V | V | V |
| 4 | FIG. 16 | V | V | V | P | P | V | V | V |
| 5 | FIG. 17 | V | V | V | V | P | V | V | V |
| 6 | | P | V | V | V | P | V | V | V |
| 7 | | V | P | V | V | P | V | V | V |
| 8 | FIG. 18 | V | V | P | V | P | V | V | V |
| 9 | FIG. 19 | V | V | V | P | P | V | V | V |
| 10 | FIG. 20 | V | V | V | V | P | V | V | V |
| 11 | | P | V | V | V | P | V | V | V |
| 12 | FIG. 21 | V | P | V | V | P | V | V | V |
| 13 | FIG. 22 | V | V | P | V | P | V | V | V |
| 14 | FIG. 23 | V | V | V | P | P | V | V | V |
| 15 | FIG. 24 | V | V | V | V | P | V | V | V |
| 16 | FIG. 25 | P | V | V | V | P | V | V | V |

The dispenser 100 starts in step 1, which has "VVVVPVVV" as the state of the eight conduits C1–C8, 331–338. The letter "V" indicates vacuum and the letter "P" indicates air pressure in the conduit. After step 1, the dispenser 100 performs steps 2–16. In Table 1, steps 2–6 are shown in one group, steps 7–11 are shown a second group and steps 12–16 are shown in a third group, because each group of five steps have the same five sets of states for the eight conduits C1–C8, 331–338. After the initial occurrence of step 1, the dispenser 100 performs steps 2–6, then repeats (at steps 7–10) the same five sets of states as was performed for steps 2–6, and then repeats again (at steps 11–16) the same five sets of states as had been performed for steps 2–6. In particular, the dispenser 100 indefinitely repeats the same five sets of states after step 16, also. The dispenser 100 does not re-enter the set of states of step 1, unless the operation is paused. Except for step 1, which has an indefinite dwell time, each step has a dwell time of about 20 msec. The dispenser 100 in accordance with the invention ejects balls 101 at a rate of about ten balls per second.

It should be noted that FIGS. 15-25 are intended to show initial loading, rather than continuous operation. The dispenser 100 is programmed to perform all the steps of Table 1 during both initial loading and continuous operation; however, five of the steps do not produce any ball movement during initial loading. There is no Drawing Figure associated with the five steps that produce no ball movement during initial loading. During initial loading, steps 2, 3, 6, 7 and 11 do not produce any ball movement because balls have not yet reached the second stop 342, the third stop 343 and the fourth stop 344 of the pneumatic singulator 370, at which steps 2, 3, 6, 7 and 11 would cause ball movement. Alternatively, the dispenser 100 is programmed to perform all the steps of Table 1 during continuous operation only, and is programmed to perform only the steps associated with FIGS. 15-25 during initial loading. During continuous operation, each step of Table 1 produces ball movement.

Figure 26:
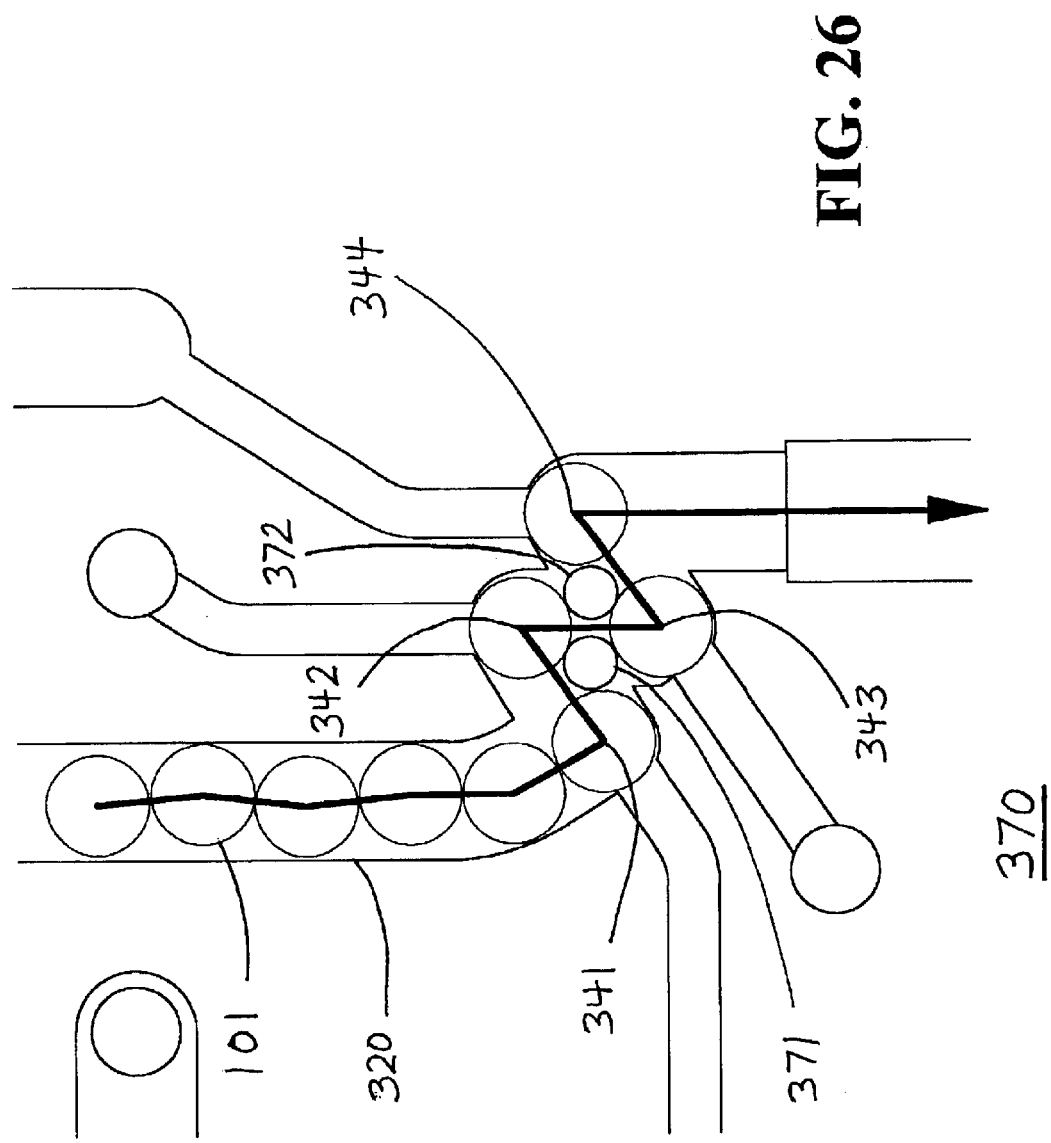
FIG. 26 is an enlarged view of the ejection area showing a path through the pneumatic singulator.

FIG. 26 is an enlarged view of the ejection area 271 showing a path through the pneumatic singulator 370. After pausing at each stop 341–344, each of the balls 101 traveling through the pneumatic singulator 370 changes course, or trajectory, by at least 45°. It should be appreciated that the movement of the balls 101 through an operating channel of the dispenser 100, which extends from opening 206 to the fourth stop 344, is accomplished solely by selective application of air pressure and vacuum at various points of the operating channel, and not by any solid object contacting a ball. The shape of the path that the balls 101 take through the dispenser 100 and the existence of the stops 341–344, advantageously allow less precise application of vacuum and pressure. In particular, the stops 341–344 permit less uncertainty as to the position of the balls 101 at any instance. The pneumatic singulator 370 comprises two vents 371, 372 for allowing the escape of air. The diameter of the vents 371, 372 are less than half the diameter of a ball 101.

Figure 27:
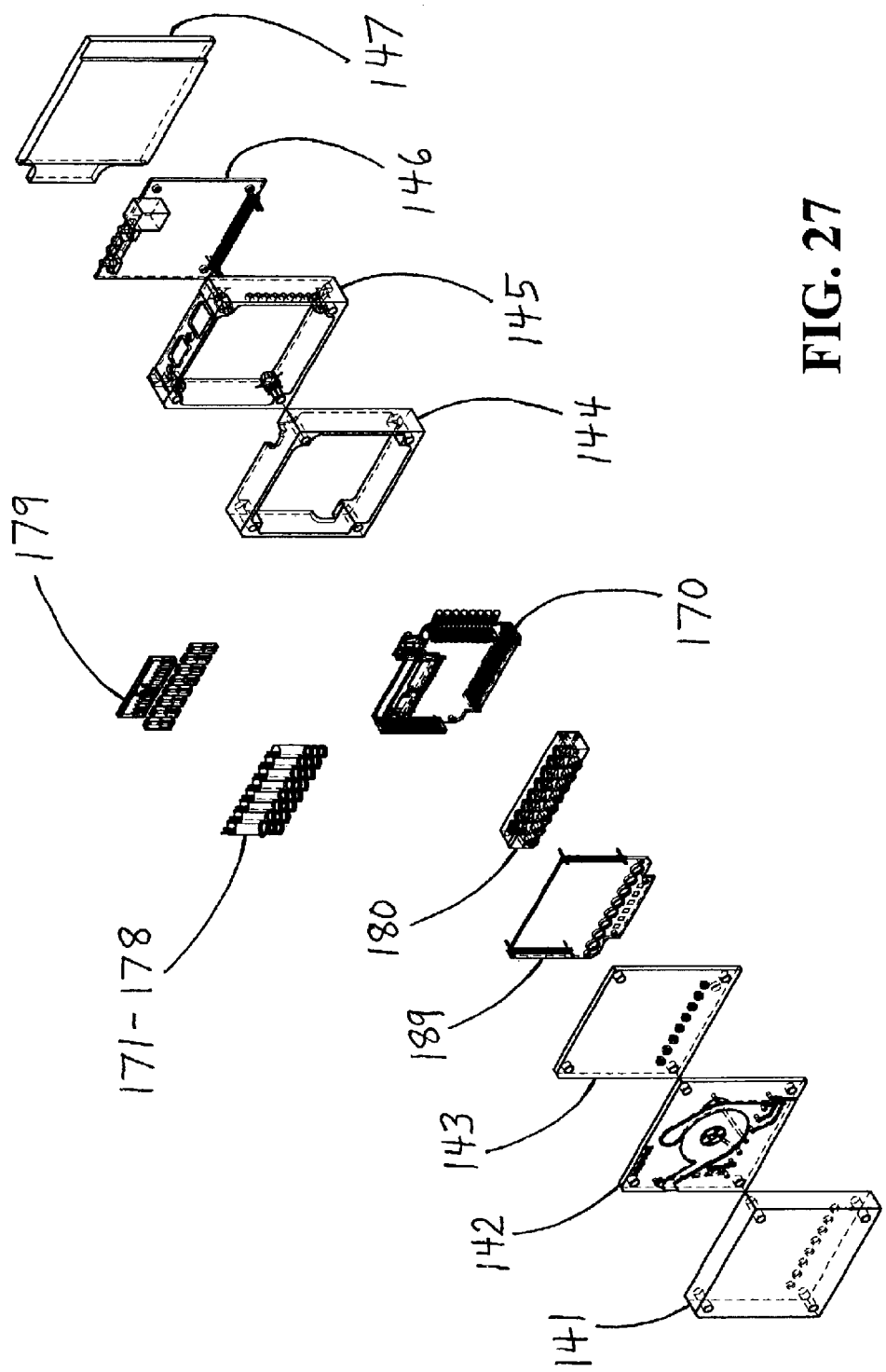
FIG. 27 is an exploded view of the head unit.

FIG. 27 is an exploded view of the head unit 108 showing the assembly of the head unit. Within the interface housing 144 is an interface board assembly 170, eight solenoids 171–178, a solenoid cable assembly 179 connected to the eight solenoids, and a manifold 180 connected to the eight solenoids 171–178 and to the eight conduits C1–C8, 331–338. A sensor board assembly 189 is attached to the interface board assembly 170. Within the manifold assembly 180 are eight valves operated by the eight solenoids 171–178 for switching one of air pressure and vacuum to the eight conduits C1–C8, 331–338. Preferably, the vacuum is about −5.9" Hg, or −2.9 psi, and the air pressure is about twenty (20) psi.

Figure 28:
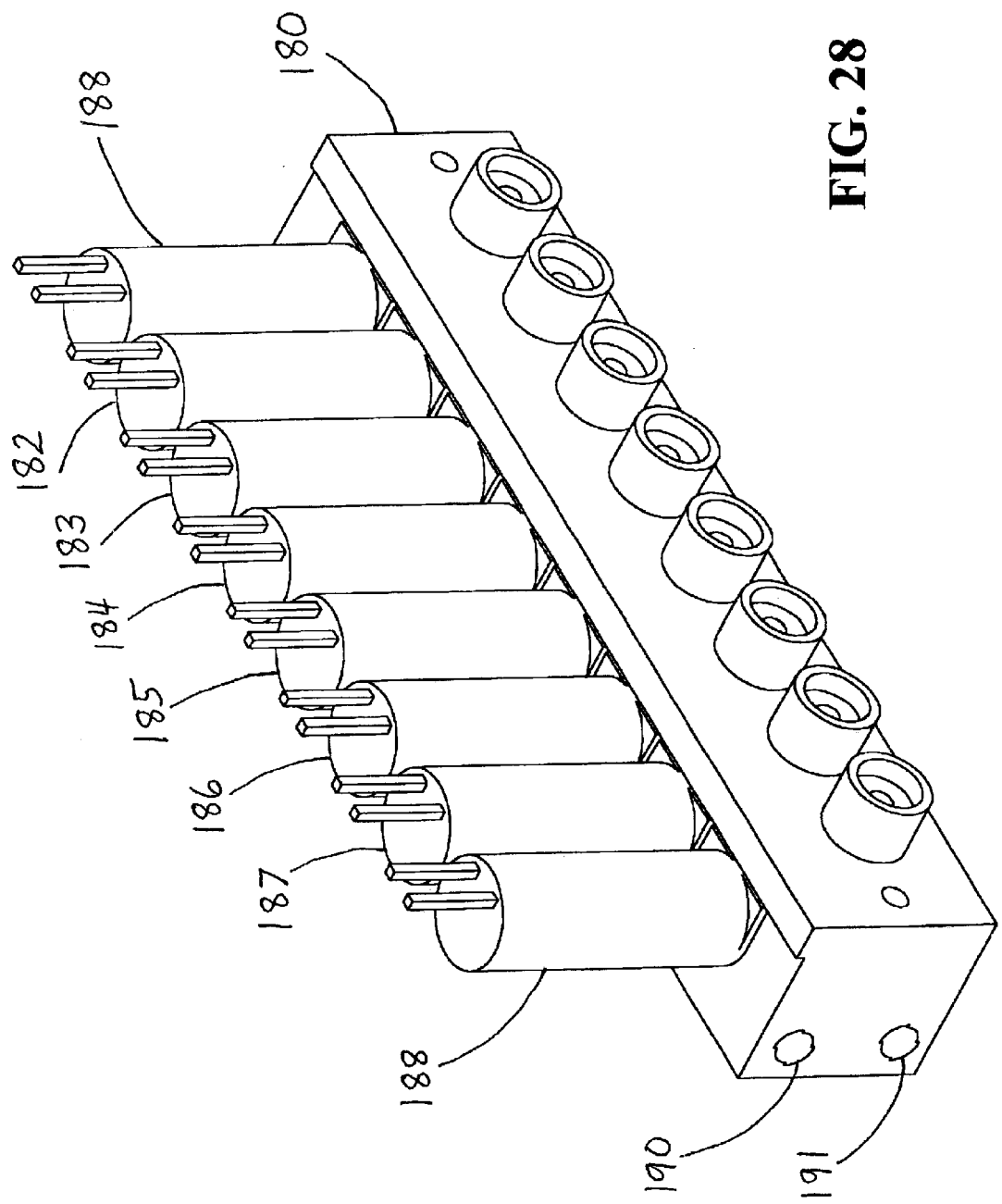
FIG. 28 is a perspective view of a manifold assembly of the solder ball dispenser.

FIG. 28 is a perspective view of a manifold assembly 180 of the dispenser 100. The manifold assembly 180 has port 190 for connection to a constant source of vacuum (not shown) and port 191 for connection to a continuous source of air pressure (not shown).

Figure 29:
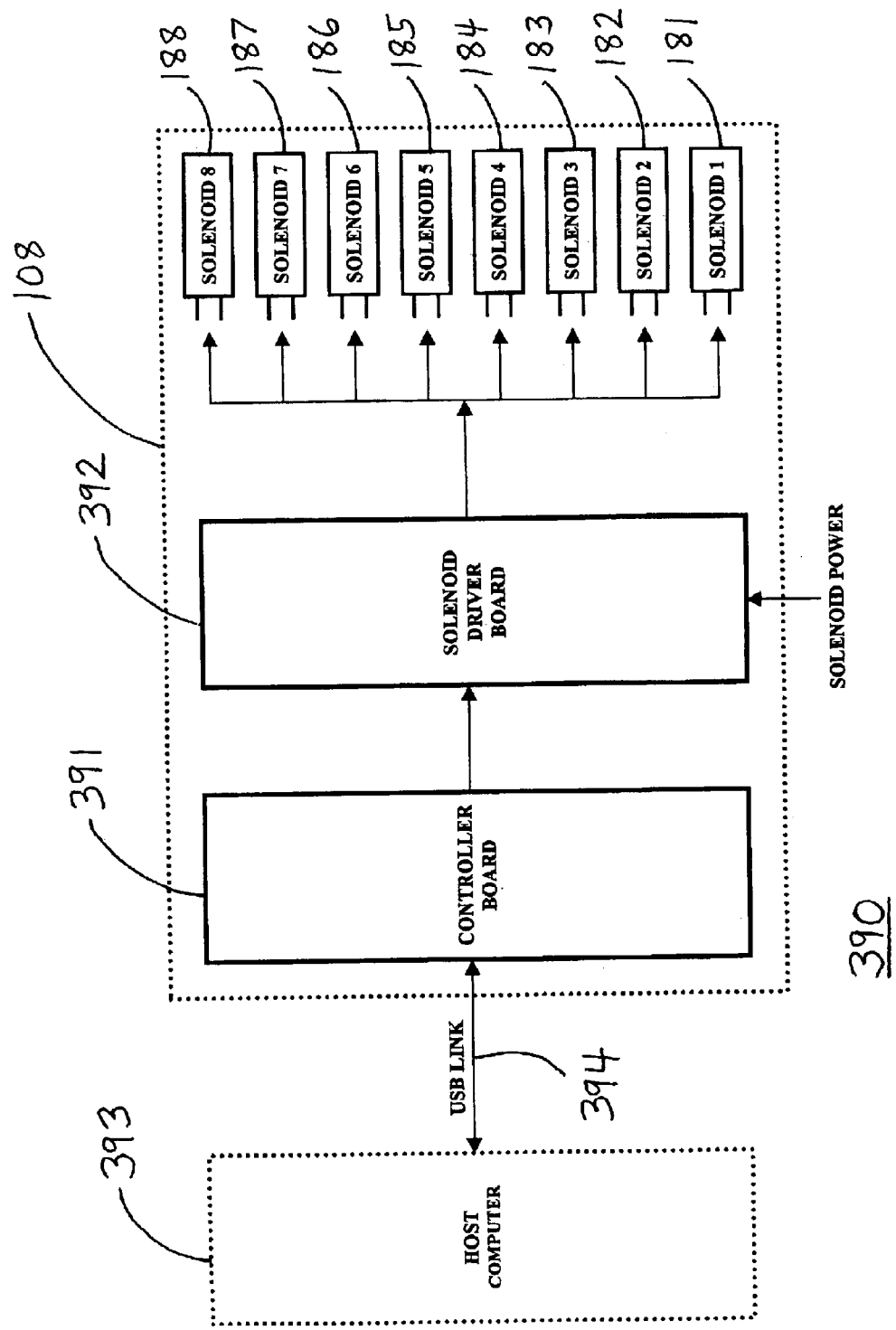
FIG. 29 is a functional electrical block diagram for controlling the manifold assembly.

FIG. 29 is a functional electrical block diagram 390 for controlling the manifold assembly 180. Within the head unit 108 are a controller board 391 electrically coupled to a solenoid driver board 392. The controller board 391 is coupled to the host computer 393 via a USB link 394. The host computer 393 is programmed to operate the dispenser 100, including performing the steps set forth in Table 1.

While the present invention has been described with respect to preferred embodiments thereof, such description is for illustrative purposes only, and is not to be construed as limiting the scope of the invention. Various modifications and changes may be made to the described embodiments by those skilled in the art without departing from the true spirit and scope of the invention as defined by the appended claims. For example, although the dispenser 100 in uses an x-y table to move the target device while the head unit 108 remains stationary, it is envisaged that the target device remains stationary and the head unit moves in the x and y directions. Although for simplicity, conduits C1–C8, 331–338 have either air pressure or vacuum in them; alternatively, one or more conduits C1–C8 are switched, at selected times, to a neutral state in order to enhance operation. Although, preferably, there are four stops 341–344, it is foreseeable that the dispenser 100 would function with a greater or smaller number of stops. It is also foreseeable that means for sensing the position of the balls 101 within the dispenser 100 can increase the ejection rate and otherwise enhance operation. Although the dispenser 100 is easily cleaned, the dispenser can be made self-cleaning by addition of actuators, to secure and to occasionally separate the plates 131–136 and 141–147, instead of bolts through the holes 137–138. It is also foreseeable to laminate more than one dispenser 100 together in order to perform multiple dispensings of balls 101 simultaneously.

LIST OF REFERENCE NUMERALS

100 Solder Ball Dispenser (Dispenser)
101 Solder Balls (Balls)
103 Frame
104 Feeder Unit
105 Base
108 Head Unit
110 X-Y Table
112 Platform
120 Ball Grid Array (BGA)
122 Connecting Portion
131–136 Flat Plates of Feeder Unit
137–138 Holes
141 Front Plate
142 Head Plate
143 Back Plate
144 Interface Housing
145 USB Housing
146 USB Controller Board Assembly
147 Head Mount
150 Test Button
151–152 Controller Status LEDs
153 Reset Button
154 USB Controller
155 Solenoid Power Connector
161–168 Solenoids LEDs
170 Interface Board Assembly
171–178 Solenoids
179 Solenoid Cable Assembly
180 Manifold
181–188 Valves
189 Sensor Board Assembly
190–191 Ports
200 Feeder Unit Chamber
204 Maximum Diameter of Feeder Unit Chamber
205 Front Side of Feeder Unit
206 Opening
207 Tubular Pathway
208 Opening
209 Inclined Pathway
210 Exit Slot
211 Point A
213 Point B
220 Bottom of Feeder Unit Chamber
221 Point C
222 Point D
225 First Void
226 Air Jet
230 Port
232 Conduit
234 Outside Port
235 Back Wall
240 Second Void
241 Opening
242 Mesh
251 Depth
270 Arrow
271 Ejection Area
300 Head Unit Chamber
304 Entrance
306 Declined Ramp
308 Outer Diameter
310 Depth of Head Unit
312 Exit
313 Entrance of Buffer Chute
320 Buffer Chute
321 Width of Buffer Chute
331–338 Conduits C1–C8
340 Stack
341–344 Mechanical Stops (Stops)
350 Arrow
351–354 Orifice
355 Arrow
360 Location
365 Air Jet
370 Pneumatic Singulator
371–372 Vents
372–383 Arrows
390 Functional Electrical Block Diagram
391 Controller Board
392 Solenoid Driver Board 393 Host Computer
394 USB Link

I claim:

1. An apparatus for dispensing a series of single solder balls, comprising:
   a curved chamber for containing a multiplicity of solder balls set in motion by gas flowing within the curved chamber;
   an elongate chamber having a first end and a second end, the first end of the elongate chamber connected to the curved chamber for receiving solder balls from the curved chamber, the elongate chamber sized to accept a single line of solder balls; and
   an ejector connected to the second end of the elongate chamber, the ejector receiving the single line of solder balls and, in response to application of gas pressure and vacuum on the solder balls, dispensing a series of single solder balls, wherein all movement of solder balls within the apparatus is caused only by application of gas pressure and vacuum.

2. The apparatus of claim 1, in which the curved chamber has the shape of a flattened cylinder having an outer diameter substantially larger than the diameter of the solder balls, and having a depth of greater than one and less than two solder ball diameters.

3. The apparatus of claim 1, in which the curved chamber has the shape of a flattened annular ring having an outer diameter substantially larger than the diameter of the solder balls and having an inner diameter, and having a depth of greater than one and less than two solder ball diameters.

4. The apparatus of claim 1, in which the elongate chamber is connected to the curved chamber at a connection point near the top of the curved chamber.

5. The apparatus of claim 1, in which the elongate chamber is tangential to the outer diameter of the curved chamber, at the connection point.

6. An apparatus for dispensing a series of single solder balls, each solder ball having a diameter, comprising:
   a substantially circular chamber having a depth of approximately the diameter of a solder ball, the substantially circular chamber having an opening for delivering blowing gas into the substantially circular chamber for setting in motion the solder balls within the substantially circular chamber, and
   a buffer chute for allowing one solder ball at a time to escape, against gravity, from the substantially circular chamber as a result of the motion of the one ball, and for temporarily storing a single line of solder balls from which the balls are dispensed.

7. The apparatus of claim 6, in which the substantially circular swirling chamber has a depth of greater than one and less than two solder ball diameters.

8. The apparatus of claim 7, in which the depth is approximately 130% of a solder ball diameter.

9. The apparatus of claim 6 including means connected to the buffer chute for ejecting one ball at a time from the apparatus.

10. An apparatus for dispensing a series of single solder balls, comprising:
    an elongate chamber holding a single line of solder balls; and
    a pneumatic singulator connected to the elongate chamber, the pneumatic singulator receiving the single line of solder balls, the pneumatic singulator having a channel for the balls, the channel having a plurality of openings for application of cycles of alternate gas pressure and vacuum to the channel, such that each half cycle causes at least one solder ball from the single line of solder balls to move from one of the plurality of openings to another of the plurality of openings.

11. The apparatus of claim 10, in which the at least one ball pauses at each of the plurality of openings, after moving in response to a half cycle application of gas pressure.

12. The apparatus of claim 10, in which the at least one solder ball also stops further application of vacuum from an opening by blocking the opening from which vacuum is emitted.

13. The apparatus of claim 12, in which the pneumatic singulator ejects the at least one solder ball from the apparatus by application of gas pressure on the solder ball.

14. The apparatus of claim 10, in which the pneumatic singulator ejects the at least one solder ball from the apparatus by application of gas pressure on the solder ball.

15. An apparatus for ejecting a series of single solder balls, comprising:
    an elongate chamber holding a single line of solder balls; and
    a pneumatic singulator connected to the elongate chamber, the pneumatic singulator receiving the single line of solder balls, the pneumatic singulator having a channel for the balls, the channel having a plurality of bends, the channel having a plurality of openings at which one of gas pressure and vacuum is applied to move solder balls through the channel such that the balls pause at each bend of the channel prior to being ejected one at a time from the apparatus.

16. The apparatus of claim 15, in which the diameter of said elongate chamber is approximately 130% of a solder ball diameter.

17. The apparatus of claim 15, in which each bend is at least 45°.

18. A method of organizing solder balls into a single line, comprising the steps of:
    swirling a multiplicity of solder balls in a first curved chamber, the first curved chamber having a size substantially larger than a solder ball diameter in all three dimensions;
    transferring at least some of the multiplicity of solder balls into a second chamber, the second chamber having a size substantially larger than a solder ball diameter in only two dimensions and having a size approximately of a solder ball diameter in the third dimension;
    swirling the at least some of the multiplicity of solder balls in the second curved chamber; and
    transferring a plurality of the at least some of the multiplicity of solder balls into an elongate chamber, the elongate chamber having a size substantially larger than a solder ball diameter in only one dimension and having a size approximately of a solder ball diameter in two dimensions.

19. A method of dispensing solder balls, comprising the steps of:
    (a) receiving a single line of solder balls;
    (b) transferring each solder ball from the single line of solder balls into a pneumatic singulator;
    (c) moving each solder ball through the pneumatic singulator using only vacuum and gas pressure;
    (d) causing each solder ball to pause at least two times while moving through the pneumatic singulator;
    (e) causing each solder ball to change trajectory by at least 45° after each pause; and (f) ejecting, one at a time, each solder ball out of the pneumatic singulator.

20. A method of dispensing solder balls, comprising the steps of:
- (a) swirling a multiplicity of solder balls in a first curved chamber, the first curved chamber having a size substantially larger than a solder ball diameter in all three dimensions;
- (b) transferring at least some of the multiplicity of solder balls into a second chamber, the second chamber having a size substantially larger than a solder ball diameter in only two dimensions and having a size approximately of a solder ball diameter in the third dimension;
- (c) swirling the at least some of the multiplicity of solder balls in the second curved chamber;
- (d) transferring a plurality of the at least some of the multiplicity of solder balls into an elongate chamber, the elongate chamber having a size substantially larger than a solder ball diameter in only one dimension and having a size approximately of a solder ball diameter in two dimensions;
- (e) transferring the plurality of the at least some of the multiplicity of solder balls into a pneumatic singulator; and
- (f) ejecting, one at a time, each solder ball of the plurality of the at least some of the multiplicity of solder balls out of the pneumatic singulator.

* * * * *